(12) United States Patent
Lee et al.

(10) Patent No.: US 12,333,105 B2
(45) Date of Patent: Jun. 17, 2025

(54) DISPLAY DEVICE HAVING TOUCH SENSING

(71) Applicant: Samsung Display Co., LTD., Yongin-si (KR)

(72) Inventors: Seung Chan Lee, Yongin-si (KR); Rae Young Gwak, Yongin-si (KR); Sang Hyun Jun, Yongin-si (KR); Gyung Min Ko, Yongin-si (KR); Dae Young Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/473,426

(22) Filed: Sep. 25, 2023

(65) Prior Publication Data

US 2024/0288963 A1     Aug. 29, 2024

(30) Foreign Application Priority Data

Feb. 27, 2023  (KR) ........................ 10-2023-0025614

(51) Int. Cl.
  *G06F 3/041*    (2006.01)
  *G06F 3/044*    (2006.01)
  (Continued)

(52) U.S. Cl.
  CPC .......... *G06F 3/0416* (2013.01); *G06F 3/0446* (2019.05); *G06V 40/1318* (2022.01);
  (Continued)

(58) Field of Classification Search
  CPC .. G06F 3/0412; G06F 3/0416; G06F 3/04166; G06F 3/041661; G06F 3/04184;
  (Continued)

(56) References Cited

U.S. PATENT DOCUMENTS

| 10,440,790 B2 | 10/2019 | Dunn et al. |
| 2020/0133414 A1* | 4/2020 | Lee ........................ G06F 3/044 |
| 2022/0027598 A1* | 1/2022 | Lee .................... G06V 40/1388 |

FOREIGN PATENT DOCUMENTS

| CN | 113161392 A | * 7/2021 | ......... H01L 27/3216 |
| KR | 10-2013-0011673 | 1/2013 | |
| KR | 10-2022-0014351 | 2/2022 | |

OTHER PUBLICATIONS

English translation of CN-113161392-A (Year: 2021).*

* cited by examiner

*Primary Examiner* — Nathan Danielsen
(74) *Attorney, Agent, or Firm* — KILE PARK REED & HOUTTEMAN PLLC

(57) ABSTRACT

A display device includes a display part including multiple unit pixels, each of the unit pixels including multiple display pixels and a light sensing pixel, multiple touch electrodes disposed between the display pixels and the light sensing pixel, surrounding circumferences of the display pixels and the light sensing pixel, and sensing a touch, and a main driving circuit sensing a fingerprint by the light sensing pixel. The light sensing pixel in one of the unit pixels and the light sensing pixel in another one of the unit pixels have different light transmissivities for external light, and the main driving circuit analyzes light sensing signals of the light sensing pixels having the different light transmissivities to detect a luminance value or an illuminance value of the external light.

15 Claims, 16 Drawing Sheets

(51) Int. Cl.
  *G06V 40/13* (2022.01)
  *H10K 59/38* (2023.01)
  *H10K 59/40* (2023.01)
  *H10K 59/65* (2023.01)
  *H10K 59/80* (2023.01)
(52) U.S. Cl.
  CPC ............ *H10K 59/38* (2023.02); *H10K 59/40* (2023.02); *H10K 59/65* (2023.02); *H10K 59/8792* (2023.02)
(58) Field of Classification Search
  CPC ........ G06F 3/042; G06F 3/044; G06F 3/0446; G06F 3/0448; G06F 2203/04106; G09G 3/32–3291; G09G 2300/421; G09G 2300/426; G09G 2300/0443; G09G 2300/0452; G09G 2300/0456; G09G 2310/08; G09G 2360/14–148; G06V 10/14–147; G06V 40/12; G06V 40/13; G06V 40/1318; H10K 59/38; H10K 59/40; H10K 59/65; H10K 59/8791; H10K 59/8792; H01L 31/0232; H01L 31/02325; H01L 31/02327; H01L 31/0475; H01L 31/12; H01L 31/14–153
  See application file for complete search history.

SP : ELU, DDU
ELU : LEL
DDU : DT, ST1, ST2, ST3, ST4, ST5, ST6, CST1

DISPLAY DEVICE HAVING TOUCH SENSING

CROSS REFERENCE TO RELATED APPLICATION(S)

This application claims priority to and benefits of Korean Patent Application No. 10-2023-0025614 under 35 U.S.C. § 119, filed on Feb. 27, 2023, in the Korean Intellectual Property Office (KIPO), the entire contents of which are incorporated herein by reference.

BACKGROUND

1. Technical Field

The disclosure relates to a display device.

2. Description of the Related Art

As the information society develops, the demand for display devices for displaying images has increased and diversified. Display devices have been applied to various electronic devices such as smartphones, digital cameras, laptop computers, tablet personal computers (PCs), navigation devices, smart televisions, and the like.

Recently, due to the development of mobile communication technology, the use of portable electronic devices such as smartphones, tablet PCs, laptop computers, and the like has significantly increased. Privacy information is stored in the portable electronic device Accordingly, a fingerprint authentication function for authenticating a user's fingerprint, which is biometric information of a user, has been used in the portable electronic device in order to protect the privacy information of the portable electronic device.

For example, the display device may recognize and authenticate the user's fingerprint using an optical method, an ultrasonic method, a capacitive method, the like, or a combination thereof. The optical method may authenticate the user's fingerprint by sensing light reflected from the user's fingerprint.

SUMMARY

The disclosure provides a display device with recognizing a user's fingerprint and sensing external light of a wider illuminance range and a wider luminance range by using a plurality of light sensing pixels having a same light transmissivity or different light transmissivities.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a display part including a plurality of unit pixels, each of the plurality of unit pixels including a plurality of display pixels and a light sensing pixel, a plurality of touch electrodes disposed between the plurality of display pixels and the light sensing pixel surrounding circumferences of the plurality of display pixels and the light sensing pixel, and sensing a touch, and a main driving circuit sensing a fingerprint by the light sensing pixel. The light sensing pixel in one of the plurality of unit pixels and the light sensing pixel in another one of the plurality of unit pixels may have different light transmissivities for external light, and the main driving circuit may analyze light sensing signals of the light sensing pixels having the different light transmissivities to detect a luminance value or an illuminance value of the external light.

In an embodiment, each of the plurality of unit pixels may include at least three display pixels displaying red, green, and blue colors, and one of first to fourth light sensing pixels having different light transmissivities, the first light sensing pixel may have a first transmissivity of a first range and detect light of a low luminance range, the second light sensing pixel may have a second transmissivity of a second range and detect light of a middle luminance range, the third light sensing pixel may have a third transmissivity of a third range and detect light of a high luminance range, and the fourth light sensing pixel may have a fourth transmissivity of a fourth range and detect light of an ultra-high luminance range.

In an embodiment, the first light sensing pixel may include a first light sensing part and a first sensing driving part, neither color filter layer nor black matrix layer may be formed on a front surface of the first light sensing part and the first light sensing part may have a first light transmissivity of about 100%, the second light sensing pixel may include a second light sensing part and a second sensing driving part, a color filter layer of one of red, green, and blue colors may be formed on a front surface of the second light sensing part and the second light sensing part may have a second light transmissivity in a range of about 24% to about 33%, the third light sensing pixel may include a third light sensing part and a third sensing driving part, two color filter layers of two of red, green, and blue colors may be formed on a front surface of the third light sensing part and the third light sensing part has a third light transmissivity in a range of about 1.1% to about 5.8%, the fourth light sensing pixel may include a fourth light sensing part and a fourth sensing driving part, and a black matrix layer may be formed on a front surface of the fourth light sensing part and the fourth light sensing part has a fourth light transmissivity in a range of about 0.3% to about 1%.

In an embodiment, the plurality of unit pixels may include a plurality of first unit pixels including first to third display pixels displaying red, green, and blue colors, respectively, and a first light sensing pixel, a plurality of second unit pixels including the first to third display pixels, and a second light sensing pixel, a plurality of third unit pixels including the first to third display pixels, and a third light sensing pixel, and a plurality of fourth unit pixels including the first to third display pixels, and a fourth light sensing pixel, the first light sensing pixel may have a first transmissivity of a first range and detect light of a low luminance range, the second light sensing pixel may have a second transmissivity of a second range and detect light of a middle luminance range, the third light sensing pixel may have a third transmissivity of a third range and detect light of a high luminance range, and the fourth light sensing pixel may have a fourth transmissivity of a fourth range and detect light of an ultra-high luminance range.

In an embodiment, the plurality of unit pixels may include a plurality of first unit pixels including first to fourth display pixels displaying red, green, blue, and green colors, respectively, and a first light sensing pixel, a plurality of second unit pixels including the first to fourth display pixels, and a second light sensing pixel, a plurality of third unit pixels including the first to fourth display pixels, and a third light sensing pixel, and a plurality of fourth unit pixels including the first to fourth display pixels, and a fourth light sensing pixel, the first light sensing pixel may have a first transmissivity of a first range and detect light of a low luminance range, the second light sensing pixel may have a second transmissivity of a second range and detect light of a middle luminance range, the third light sensing pixel may have a third transmissivity of a third range and detect light of a high luminance range, and the fourth light sensing pixel may have a fourth transmissivity of a fourth range and detect light of an ultra-high luminance range.

In an embodiment, the number of the plurality of first to fourth unit pixels disposed in a unit area may be a ratio of about 1:3:3:1, the plurality of first to third unit pixels may be arranged in a zigzag pattern in a first direction, and one of the plurality of first unit pixels, one of the plurality of second unit pixels, one of the plurality of third unit pixels, and another one of the plurality of third unit pixels may be repeatedly arranged in the first direction.

In an embodiment, a first light sensing part of the first light sensing pixel, a second light sensing part of the second light sensing pixel, a third light sensing part of the third light sensing pixel, and the third light sensing part of the third light sensing pixel may be repeatedly arranged in odd-numbered unit pixel rows in a zigzag pattern in the first direction, neither color filter layer nor black matrix layer may be formed on a front surface of the first light sensing part and the first light sensing part may have a first light transmissivity of about 100%, a color filter layer of one of red, green, and blue colors may be formed on a front surface of the second light sensing part and the second light sensing part may have a second light transmissivity in a range of about 24% to about 33%, and two color filter layers of two of red, green, and blue colors are formed on a front surface of the third light sensing part and the third light sensing part may have a third light transmissivity in a range of about 1.1% to about 5.8%.

In an embodiment, one of the plurality of second unit pixels, another one of the plurality of second unit pixels, one of the plurality of third unit pixels, and one of the plurality of fourth unit pixels may be repeatedly arranged in a zigzag pattern in the first direction.

In an embodiment, a second light sensing part of the second light sensing pixel, the second light sensing part of the second light sensing pixel, a third light sensing part of the third light sensing pixel, and a fourth light sensing part of the fourth light sensing pixel may be repeatedly arranged in even-numbered unit pixel rows in a zigzag pattern in the first direction, a color filter layer of one of red, green, and blue colors may be formed on a front surface of the second light sensing part and the second light sensing part may have a second light transmissivity in a range of about 24% to about 33%, color filter layers of two of red, green, and blue colors may be formed as double layers on a front surface of the third light sensing part and the third light sensing part may have a third light transmissivity in a range of about 1.1% to about 5.8%, and a black matrix layer may be formed on a front surface of the fourth light sensing part and the fourth light sensing part may have a fourth light transmissivity in a range of about 0.3% to about 1%.

In an embodiment, the main driving circuit may convert the light sensing signals generated from the first light sensing pixel into digital light sensing signals, compare and analyze the digital light sensing signals of the first light sensing pixel with low luminance and low illuminance reference data, and detect a luminance value and an illuminance value for external light of low luminance and low illuminance ranges, convert the light sensing signals generated from the second light sensing pixel into digital light sensing signals, compare and analyze the digital light sensing signals with preset middle luminance and middle illuminance reference data, and detect a luminance value and an illuminance value for external light of middle luminance and middle illuminance ranges, convert the light sensing signals generated from the third light sensing pixel into digital light sensing signals, compare and analyze the digital light sensing signals of the third light sensing pixel with high luminance and high illuminance reference data, and detect a luminance value and an illuminance value for external light of high luminance and high illuminance ranges, and convert the light sensing signals generated from the fourth light sensing pixel into digital light sensing signals, compare and analyze the digital light sensing signals of the fourth light sensing pixel with ultra-high luminance and ultra-high illuminance reference data, and detect a luminance value and an illuminance value for external light of ultra-high luminance and ultra-high illuminance ranges.

According to an embodiment of the disclosure, a display device may include a display part including a plurality of unit pixels, and a main driving circuit sensing a fingerprint by light sensing pixels each included in the plurality of unit pixels. The plurality of unit pixels may include at least three display pixels displaying red, green, and blue colors, and one of first to fourth light sensing pixels having different light transmissivities, and the main driving circuit may analyze light sensing signals of the first to fourth light sensing pixels to detect a luminance value or an illuminance value of external light.

In an embodiment, the first light sensing pixel may have a first transmissivity of a first range and detect light of a low luminance range, the second light sensing pixel may have a second transmissivity of a second range and detect light of a middle luminance range, the third light sensing pixel may have a third transmissivity of a third range and detect light of a high luminance range, and the fourth light sensing pixel may have a fourth transmissivity of a fourth range and detect light of an ultra-high luminance range.

According to an embodiment of the disclosure, a display device may include a light emitting part including a display part in which a plurality of unit pixels each including a plurality of display pixels and a light sensing pixel are alternately and sequentially arranged, the plurality of display pixels emitting one of red, green, and blue colors, a pixel driving part controlling a driving of the light emitting part, and at least one color filter layer covering the light emitting part and transmitting light of one of red, green, and blue colors. The light sensing pixel may include a light sensing part including a light sensing element, and a sensing driving part controlling a driving operation of the light sensing part, and a front surface of the light sensing part may be opened or the at least one color filter layer or at least one black matrix layer may be disposed on the front surface of the light sensing part.

In an embodiment, each of the plurality of unit pixels may include at least three display pixels displaying red, green, and blue colors, and one of first to fourth light sensing pixels having different light transmissivities.

A display device according to embodiments of the disclosure may recognize a user's fingerprint and sense external light of wider luminance and illumination ranges from a low luminance range to an ultra-high luminance range, by using a plurality of light sensing pixels having a same light transmissivity or different light transmissivities. Accordingly, light sensing efficiency and accuracy using the display device may be further improved.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
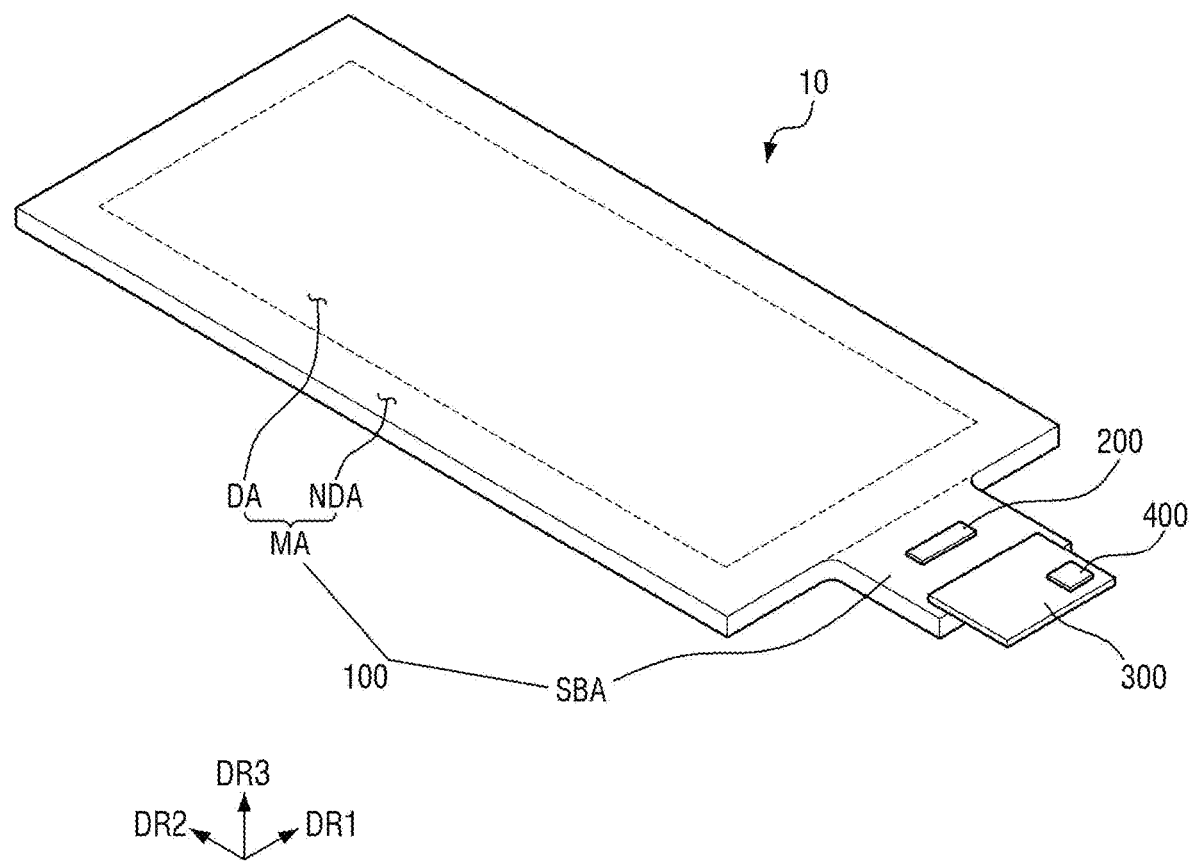
FIG. 1 is a schematic perspective view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

The embodiments will now be described more fully hereinafter with reference to the accompanying drawings, in which embodiments of the disclosure are shown. The disclosure may, however, be embodied in different forms and should not be construed as limited to the embodiments set forth herein. Rather, these embodiments are provided so that this disclosure will be more thorough and complete, and will fully convey the scope of the disclosure to those skilled in the art.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising." "includes," "including." "haves," and/or "having." when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially." "about," and other similar terms, are used as terms of approximation and not as terms of degree, and, as such, are utilized to account for inherent deviations in measured, calculated, and/or provided values that would be recognized by one of ordinary skill in the art.

When an element, such as a layer, film, region, or substrate is referred to as being "on" or "connected to" another element, it may be directly on, connected to, or coupled to the other element or intervening elements may be present. When, however, an element or layer is referred to as being "directly on" or "directly connected to" another element or layer, there are no intervening elements or layers present. To this end, the term "connected" may refer to physical, electrical, and/or fluid connection, with or without intervening elements. Further, the first direction DR1 (or referred to as X-axis direction), the second direction DR2 (or referred to as Y-axis direction), and the third direction DR3 (or referred to as Z-axis direction) are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" may be construed as X only, Y only, Z only, or any combination of two or more of X, Y, and Z, such as, for instance, XYZ, XYY, YZ, and ZZ. Also, "at least two of X, Y, and Z," may be construed as two or more of X, Y, and Z such as both X and Y, both X and Z, both Y and Z, both X. Y, and Z.

It will also be understood that when a layer is referred to as being "on" another layer or substrate, it can be directly on the other layer or substrate, or intervening layers may also be present. In contrast, when an element is referred to as being "directly on" another element, no intervening elements are present. The same reference numbers indicate the same components throughout the specification.

It will be understood that when an element such as a layer, film, region, or substrate is referred to as being "on" or "over" another element, it can be directly on the other element or intervening element(s) may also be present. In contrast, when an element is referred to as being "directly on" another element, no intervening elements are present.

When a component is described herein to "connect" another component to the other component or to be "connected to" other components, the components may be connected to each other as separate elements, or the components may be integral with each other.

Throughout the specification, when an element is referred to as being "connected" to another element, the element may be "directly connected" to another element, or "electrically connected" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Spatially relative terms, such as "below," "lower." "upper." "side," and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the disclosure. Further, the blocks, units, and/or modules of some example embodiments may be physically combined into more complex blocks, units, and/or modules without departing from the scope of the disclosure.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The display surface may be parallel to a surface defined by a first direction DR1 and a second direction DR2. A normal direction of the display surface, i.e., a thickness direction of the display device 10, may indicate a third direction DR3. In this specification, an expression of "when viewed from the top or in a plan view" may represent a case when viewed in the third direction DR3. Hereinafter, a front surface (or a top surface) and a rear surface (or a bottom surface) of each of layers or units may be distinguished by the third direction DR3. However, directions indicated by the first to third directions DR1, DR2, and DR3 may be a relative concept, and converted with respect to each other, e.g., converted into opposite directions.

Each of the features of the various embodiments of the disclosure may be combined or combined with each other, in part or in whole, and technically various interlocking and driving are possible. Each embodiment may be implemented independently of each other or may be implemented together in an association.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described with reference to the accompanying drawings.

Figure 2:
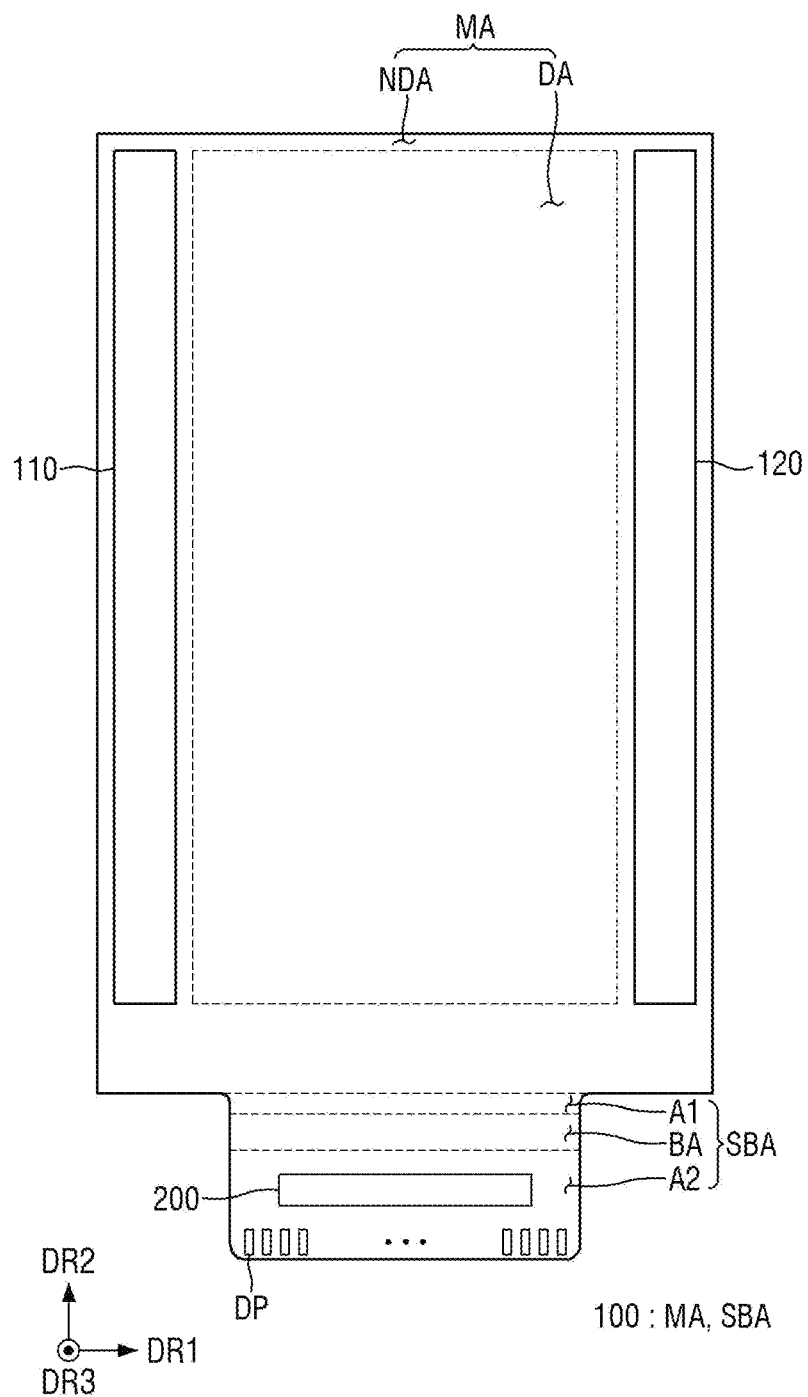
FIG. 2 is a schematic plan view illustrating a layout structure of a display panel and a display driving circuit of FIG. 1 according to an embodiment.

FIG. 1 is a schematic perspective view illustrating a display device 10 according to an embodiment. FIG. 2 is a schematic plan view illustrating a layout structure of a display panel 10 and a display driving circuit of FIG. 1.

Referring to FIGS. 1 and 2, a display device 10 according to an embodiment may be applied to portable electronic devices such as mobile phones, smartphones, tablet personal computers (PCs), mobile communication terminals, electronic notebooks, electronic books, portable multimedia players (PMPs), navigation devices, ultra mobile PCs (UMPCs), and the like. In another embodiment, the display device 10 according to an embodiment may be applied as a display part of televisions, laptop computers, monitors, billboards, or Internet of Things (IOTs). In another embodiment, the display device 10 according to an embodiment may be applied to wearable devices such as smart watches, watch phones, glasses-type displays, head mounted displays (HMDs), and the like. In another embodiment, the display device 10 according to an embodiment may be applied to a center information display (CID) disposed on an instrument board, a center fascia, or a dashboard of a vehicle, a display disposed on a rear surface (or a bottom surface) of a front seat as entertainment for a rear seat of the vehicle, or the like.

The display device 10 may be a light emitting display device such as an organic light emitting display device using an organic light emitting diode, a quantum dot light emitting display device including a quantum dot light emitting layer, an inorganic light emitting display device including an inorganic semiconductor, a micro light emitting display device using a micro light emitting diode or a nano light emitting diode (micro LED or nano LED), and the like. Hereinafter, it will be mainly described that the display device 10 is the organic light emitting display device, but the disclosure is not limited thereto.

A display panel 100 may have a rectangular shape, in a plan view, having short sides in a first direction DR1 and long sides in a second direction DR2 intersecting the first direction DR1. A corner where the short side in the first direction DR1 and the long side in the second direction DR2 meet may be right-angled or rounded with a curvature (e.g., a predetermined or selectable curvature). A shape of the display panel 100 in a plan view is not limited to a rectangle, and the shape of the display panel 100 may be another polygon, a circle, an ellipse, or the like. The display panel 100 may be flat, but the disclosure is not limited thereto. For example, the display panel 100 may include curved surface portions formed at left and right sides of the display panel 100 and having a constant curvature or a variable curvature. The display panel 100 may be flexibly formed to be curved, bent, folded, rolled, or the like.

A substrate SUB of the display panel 100 may be divided into a main area MA and a sub-area SBA.

The main area MA may be divided into a display area DA displaying an image and a non-display area NDA, which is a peripheral area of the display area DA.

The non-display area NDA may be disposed adjacent to the display area DA. For example, the non-display area NDA may be an area surrounding the display area DA. The non-display area NDA may surround the display area DA. The non-display area NDA may be an edge area of the display panel 100.

The display area DA may include display pixels (see, e.g., SP of FIG. 5) displaying an image and light sensing pixels (see, e.g., LSP of FIG. 5) sensing light incident through a protective cover, a glass, or the like, of a front surface (or a top surface). The light sensing pixels may sense light reflected from a user's body part, such as a finger or the like. The light sensing pixels may have different transmittances for external light to sense external light of different luminance ranges for each of low luminance range, middle luminance range, high luminance range, ultra-high luminance range, and the like. The light sensing pixels may have different light transmissivities to sense external light of different illuminance ranges for each of low illuminance range, medium illuminance range, high illuminance range, ultra-high illuminance range, and the like. For example, the light reflected from the user's body part, such as the finger or the like, may be sensed using first light sensing pixels having a light transmissivity of about 100% so as to sense light of the low luminance range or the low illuminance range. For example, second light sensing pixels having a light transmissivity in a range of about 24% to about 33% may sense light of the middle luminance range or the middle illuminance range. For example, third light sensing pixels having a light transmissivity in a range of about 1.1% to about 5.8% may sense light of the high luminance range or the high illuminance range. For example, fourth light sensing pixels having a light transmissivity in a range of about 0.3% to about 1% may sense light of the ultra-high luminance range or the ultra-high illuminance range.

The display area DA in which the display pixels as well as the first to fourth light sensing pixels, for example, the light sensing pixels are arranged, may occupy the main area MA (e.g., most of the main area MA). The display area DA may be disposed at a center of the main area MA.

Figure 3:
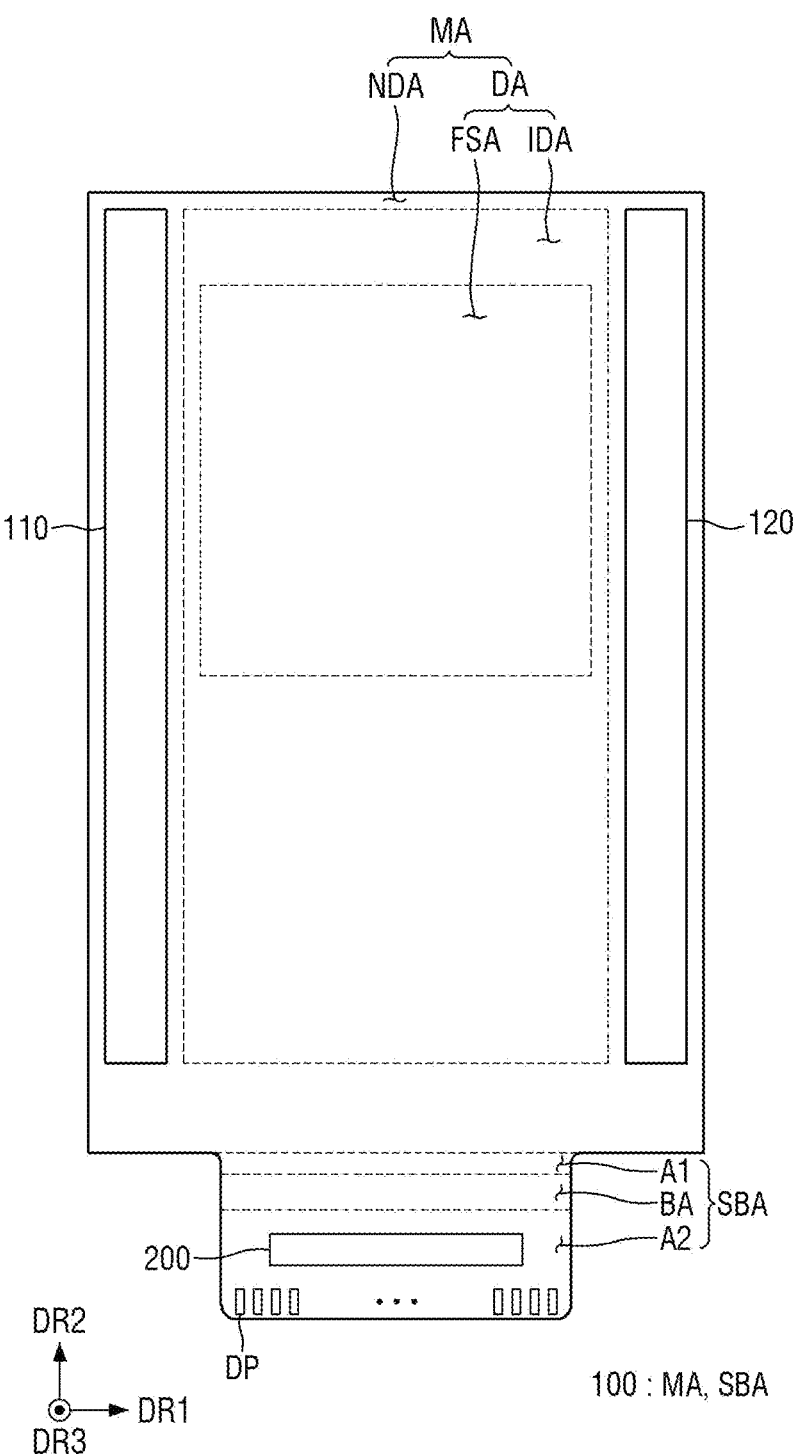
FIG. 3 is a schematic plan view illustrating a layout structure of a display panel and a display driving circuit of FIG. 1 according to another embodiment.
Figure 4:
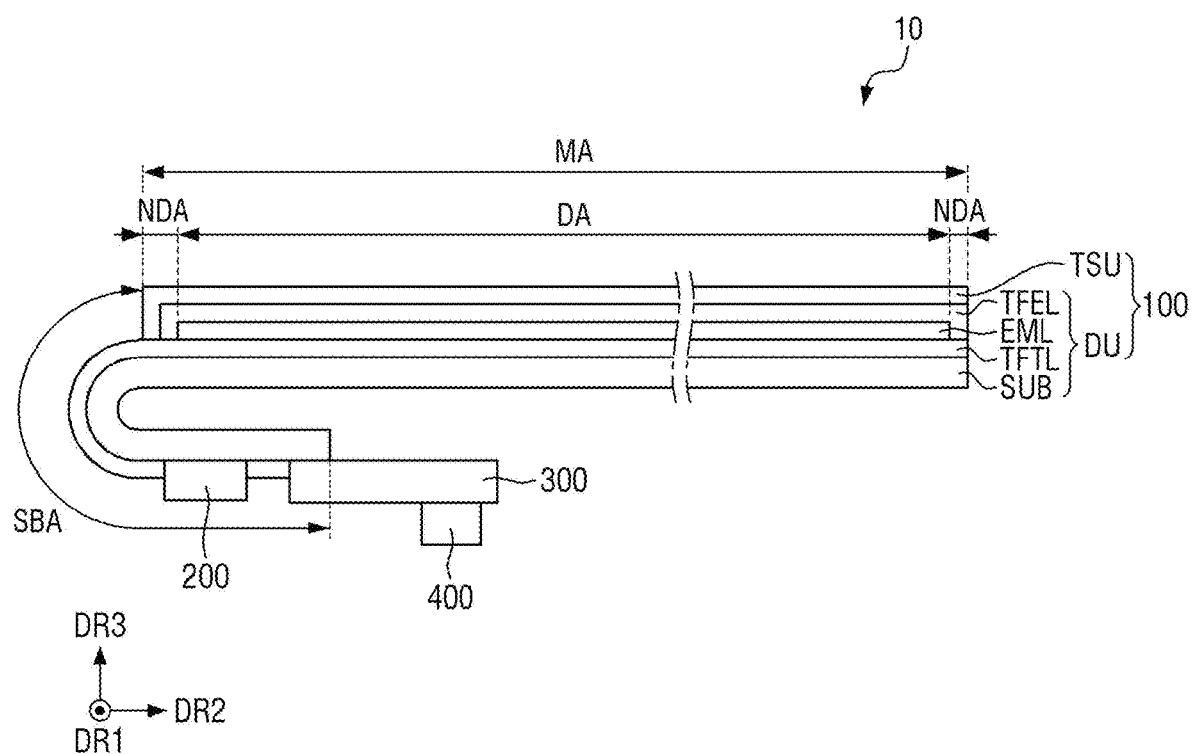
FIG. 4 is a schematic side view illustrating a display device according to an embodiment.

FIG. 3 is a schematic plan view illustrating a layout structure of a display panel 100 and a display driving circuit of FIG. 1 according to another embodiment. FIG. 4 is a schematic side view illustrating the display device 10 according to an embodiment.

Referring to FIG. 3, the display area DA may be divided into an image display area IDA in which the light sensing pixels are not disposed and only the display pixels are disposed, and a light sensing area FSA in which both the display pixels (see, e.g., SP of FIG. 5) and the light sensing pixels (see, e.g., LSP of FIG. 5) are disposed. For example, the light sensing pixels that senses light incident on or reflected from the front surface may be disposed together with the display pixels only in the light sensing area FSA, which is a portion of the display area DA (e.g., the entire display area DA) of the display panel 100. An embodiment in which the display pixels and the light sensing pixels are alternately arranged in the entire area of the display area DA will hereinafter be described.

The sub-area SBA may protrude from a side of the main area MA in the second direction DR2 (or in a direction opposite the second direction DR2). A length of the sub-area SBA in the second direction DR2 (or in a direction opposite the second direction DR2) may be less than a length of the main area MA in the second direction DR2. A length of the sub-area SBA in the first direction DR1 may be less than a length of the main area MA in the first direction DR1, or the length of the sub-area SBA in the first direction DR1 and the length of the main area MA in the first direction DR1 may be substantially the same.

The sub-area SBA may include a first area A1, a second area A2, and a bending area BA.

The first area A1 may be an area protruding from a side of the main area MA in the second direction DR2 (or in a direction opposite the second direction DR2). A side of the first area A1 may contact the non-display area NDA of the main area MA, and another side of the first area A1 may contact the bending area BA.

The second area A2 may be an area in which pads DP and a main driving circuit 200 are disposed. The main driving circuit 200 may be attached to driving pads of the second area A2 using a conductive adhesive member such as an anisotropic conductive layer or the like. A circuit board 300 may be attached to the pads DP of the second area A2 using a conductive adhesive member or the like. A side of the second area A2 may contact the bending area BA.

The bending area BA may be an area that is bendable. In case that the bending area BA is bent, the second area A2 may be disposed below the first area A1 and below the main area MA. The bending area BA may be disposed between the first area A1 and the second area A2. A side of the bending area BA may contact the first area A1, and another side of the bending area BA may contact the second area A2.

As illustrated in FIG. 4, the sub-area SBA may be bent, and at least a portion of the sub-area SBA may be disposed below the main area MA. The sub-area SBA may overlap the main area MA in a third direction DR3 intersecting the first direction DR1 and the second direction DR2.

A touch sensing part TSU sensing a touch position of a body part such as a finger or the like may be disposed on a front surface portion of the display panel 100 including the display area DA. The touch sensing part TSU may include multiple touch electrodes to sense a user's touch in a capacitive manner.

The touch sensing part TSU may include the touch electrodes arranged to intersect each other in the first and second directions DR1 and DR2. For example, the touch electrodes may be formed in the display area DA (or the non-display area) where lines are formed and extend between the display pixels and the light sensing pixels so as not to overlap the display pixels and the light sensing pixels in a plan view. In an embodiment, the touch electrodes may surround circumferences of the display pixels and the light sensing pixel. The touch electrodes may form mutual capacitance, and transmit touch sensing signals that vary according to the user's touch to a touch sensing circuit 400.

The touch sensing circuit 400 may sense changes in mutual capacitance between the touch electrodes input from the touch electrodes, and supply touch data according to the changes in mutual capacitance, coordinate data of a position where the user's touch is sensed, and the like, to the main driving circuit 200.

The circuit board 300 may be attached to an end of the sub-area SBA. The touch sensing circuit 400 may be mounted on the circuit board 300 and electrically connected to the touch electrodes of the touch sensing part TSU. The circuit board 300 may be electrically connected to the display panel 100 and the main driving circuit 200. The display panel 100 and the main driving circuit 200 may receive digital video data, timing signals, and driving voltages through the circuit board 300. The circuit board 300 may be a flexible printed circuit board, a printed circuit board, a flexible film such as a chip on film, or the like.

The main driving circuit 200 may generate digital data and electrical control signals for driving the display panel 100. Each of the main driving circuit 200 and the touch sensing circuit 400 may be formed as an integrated circuit (IC). Each of the main driving circuit 200 and the touch sensing circuit 400 may be attached onto the display panel 100 and/or the circuit board 300 in a chip on glass (COG) manner, a chip on plastic (COP) manner, an ultrasonic bonding manner, or the like, but the disclosure is not limited thereto. In an embodiment, the main driving circuit 200 and the touch sensing circuit 400 may also be attached on the circuit board 300 in a chip on film (COF) manner.

Figure 5:
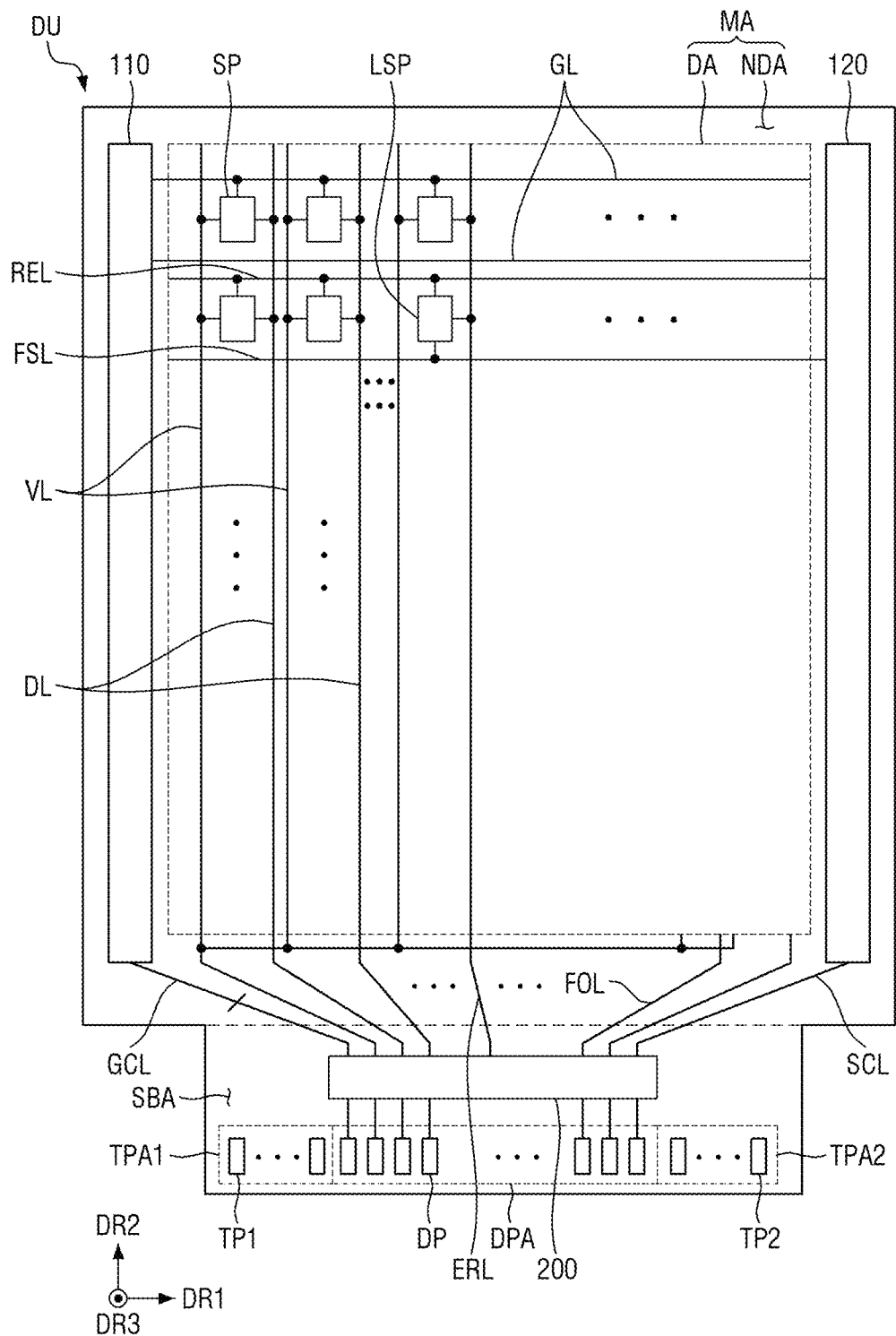
FIG. 5 is a schematic plan view illustrating a display panel of FIGS. 1 to 4 according to an embodiment.

FIG. 5 is a schematic plan view illustrating the display panel 100 of FIGS. 1 to 4 according to an embodiment. FIG. 5 is a plan view illustrating a layout of a display area DA and a non-display area NDA of a display module DU in a state before the touch sensing part TSU is formed.

Referring to FIG. 5 together with FIG. 4, a display scan driver 110, a light sensing scan driver 120, and the main driver circuit 200 may be disposed on the display panel 100 of the display device 10 according to an embodiment. The touch sensing circuit 400, a power supply unit (not illustrated), and the like, may be disposed on the circuit board 300 connected to the display panel 100. Both the main driving circuit 200 and the touch sensing circuit 400 may be integrally formed as a one-chip type and may be mounted on the display panel 100 or the circuit board 300. However, for convenience of functional explanation, an embodiment in which the main driving circuit 200 and the touch sensing circuit 400 are formed as a separate integrated circuit will hereinafter be described.

Referring to FIG. 5, the display panel 100 may include display pixels SP, light sensing pixels LSP, display scan lines GL, emission control lines VL, data lines DL, light sensing scan lines FSL, sensing reset lines REL, and light sensing lines ERL that are disposed in the display area DA. Each of the display scan driver 110 and the light sensing scan driver 120 may be disposed in the non-display area NDA.

The display scan lines GL may sequentially supply display scan signals applied in units of each horizontal line from the display scan driver 110 to multiple display pixels SP for each horizontal line. The display scan lines GL may extend in the first direction DR1 and may be spaced apart from each other in the second direction DR2 intersecting the first direction DR1.

The emission control lines VL may sequentially supply emission control signals applied in units of each horizontal line (or each vertical line) from the display scan driver 110 to the display pixels SP for each horizontal line (or vertical line). The emission control lines VL may extend in the second direction DR2 perpendicular to the display scan lines GL and may be spaced apart from each other in the first direction DR1 intersecting the second direction DR2.

The data lines DL may supply data voltages received from the main driving circuit 200 to the display pixels SP. Multiple data lines DL may extend in the second direction DR2 and may be spaced apart from each other in the first direction DR1.

The light sensing scan lines FSL may sequentially supply sensing scan signals applied in units of each horizontal line from the light sensing scan driver 120 to multiple light sensing pixels LSP. The light sensing scan lines FSL may extend in the first direction DR1 and may be spaced apart from each other in the second direction DR2 intersecting the first direction DR1.

The sensing reset lines REL may sequentially supply sensing reset signals applied in units of each horizontal line from the light sensing scan driver 120 to the light sensing pixels LSP for each horizontal line. The sensing reset lines REL may extend in the first direction DR1 in parallel with the light sensing scan lines FSL and may be spaced apart from each other in the second direction DR2 intersecting the first direction DR1.

The light sensing lines ERL may be connected between the light sensing pixels LSP and the main driving circuit 200 to supply light sensing signals output from the light sensing pixels LSP to the main driving circuit 200. The light sensing lines ERL may extend in the second direction DR2 according to a direction in which the main driving circuit 200 is disposed and be spaced apart from each other in the first direction DR1.

The non-display area NDA may surround the display area DA. The non-display area NDA may include the display scan driver 110, the light sensing scan driver 120, fan-out lines FOL, gate control lines GCL, and light sensing control lines SCL.

The display pixels SP and the light sensing pixels LSP may be arranged in a matrix form in the first direction DR1 and the second direction DR2 in the display area DA. For example, three display pixels SP displaying red light, green light, and blue light, respectively, and a light sensing pixel LSP may constitute a unit pixel. The three display pixels SP may include a red display pixel SP, a green display pixel SP, and a blue display pixel SP. In another example, four display pixels SP displaying red light, green light, blue light, and green light, respectively, and a light sensing pixel LSP may constitute a unit pixel.

In an embodiment, red, green, and blue display pixels SP and a light sensing pixel LSP constituting a unit pixel may be alternately arranged in a horizontal stripe form or a vertical stripe form. In an embodiment, the unit pixels may be arranged in a PenTile™ matrix form. For example, red, green, and blue display pixels SP and a light sensing pixel LSP may be alternately arranged in a matrix form. Each of the red, green, and blue display pixels SP may be connected to one of the display scan lines GL and one of the emission control lines VL. The display pixels SP may receive a data voltage from the data lines DL according to the display scan signals of the display scan lines GL and an emission control signal from the emission control lines VL and supply driving currents to light emitting elements according to the data voltages to emit light.

The light sensing pixels LSP may be arranged alternately with the red, green, and blue display pixels SP in a vertical direction or a horizontal direction. Each of the light sensing pixels LSP may be connected to one of the light sensing scan lines FSL, one of the sensing reset lines REL, and one of the light sensing lines ERL.

Each of the light sensing pixel LSP may be reset in response to the sensing reset signal from the sensing reset lines REL, and may generate a light sensing signal corresponding to an amount of reflected light incident from a front surface. Each of the light sensing pixel LSP may transmit the light sensing signal to the light sensing lines ERL in response to the sensing scan signal from the light sensing scan lines FSL. In another embodiment, each of the light sensing pixel LSP may be connected to one of the display scan lines GL in units of horizontal lines. The light sensing pixels LSP may generate a light sensing signal corresponding to the amount of reflected light incident from the front surface, and output the light sensing signal to the light sensing lines ERL in response to the display scan signal input through the display scan lines GL.

The display scan driver 110 may be disposed in the non-display area NDA. FIG. 5 illustrates that the display scan driver 110 is disposed on a side (e.g., the left side) of the display panel 100, but the disclosure is not limited thereto. For example, the display module DU may include more than one display scan drivers 110, and the display scan drivers 110 may be disposed on both sides (e.g., left and right sides) of the display panel 100.

The display scan driver 110 may be electrically connected to the main driving circuit 200 through the gate control lines GCL. The display scan driver 110 may receive scan control signals from the main driving circuit 200, sequentially generate display scan signals in units of horizontal line driving periods according to the scan control signals, and sequentially supply the display scan signals to the display scan lines GL. The display scan driver 110 may sequentially generate emission control signals according to the scan control signals from the main driving circuit 200 and sequentially supply the emission control signals to the emission control lines VL.

The gate control lines GCL may extend from the main driving circuit 200 to the display scan driver 110 depending on a position where the display scan driver 110 is disposed. The gate control lines GCL may supply the scan control signals received from the main driving circuit 200 to the display scan driver 110.

The light sensing scan driver 120 may be disposed in a non-display area NDA. The light sensing scan driver 120 and the display scan driver 110 may be disposed in different areas of the non-display area NDA. FIG. 5 illustrates that the light sensing scan driver 120 is disposed on another side (e.g., the right side) of the display panel 100, but the disclosure is not limited thereto. The light sensing scan driver 120 may be electrically connected to the main driving circuit 200 through the light sensing control lines SCL. The light sensing scan driver 120 may receive light sensing control signals from the main driving circuit 200 and sequentially generate reset control signals and sensing scan signals in units of horizontal line driving periods according to the light sensing control signals. The light sensing scan driver 120 may sequentially supply the sequentially generated reset control signals to the sensing reset lines REL. The light sensing scan driver 120 may sequentially generate the sensing scan signals according to the light sensing control signals from the main driving circuit 200 and sequentially supply the sensing scan signals to the light sensing scan lines FSL.

The light sensing control lines SCL may extend from the main driving circuit 200 to the light sensing scan driver 120 depending on a position where the light sensing scan driver 120 is disposed. The light sensing control lines SCL may supply the light sensing control signals received from the main driving circuit 200 to the light sensing scan driver 120.

The sub-area SBA may include the main driving circuit 200, a display pad area DPA, and first and second touch pad areas TPA1 and TPA2. The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to the circuit board 300 using an anisotropic conductive layer, a low-resistance high-reliability material such as a self assembly anisotropic conductive paste (SAP), or the like.

The fan-out lines FOL may extend from the main driving circuit 200 to the display area DA. The fan-out lines FOL may be connected to the main driver circuit 200 and the data lines DL so that the data voltages received from the main driving circuit 200 may be supplied to the data lines DL.

The main driving circuit 200 may output signals and voltages for driving the display panel 100 to the fan-out lines FOL. The main driving circuit 200 may supply the data voltages to the data lines DL through the fan-out lines FOL. The data voltages may be supplied to the display pixels SP, and may determine luminance of the display pixels SP. The main driving circuit 200 may supply the scan control signals to the display scan driver 110 through the gate control lines GCL. According to touch coordinate data of the touch sensing circuit 400, the main driving circuit 200 may generate digital video data corresponding to touch coordinates or execute an application indicated by an icon displayed at user's touch coordinates.

The main driving circuit 200 may generate the light sensing control signals for controlling the driving of the light sensing scan driver 120 and supply the light sensing control signals to the light sensing control lines SCL. For example, the main driving circuit 200 may generate the light sensing control signals and transmit the light sensing control signals to the light sensing scan driver 120 so that the reset control signals and the sensing scan signals may be sequentially supplied to the light sensing pixels LSP during a fingerprint sensing period or a light sensing period.

The main driving circuit 200 may convert the light sensing signals input through the light sensing lines ERL into digital light sensing signals and analyzes magnitudes of the digital light sensing signals to detect a luminance value or an illuminance value of light reflected from a fingerprint or light incident from the front surface. For example, the main driving circuit 200 may receive light sensing signals generated from the first light sensing pixels through the light sensing lines ERL connected to the first light sensing pixels. The main driving circuit 200 may detect a user's fingerprint by converting the light sensing signals generated from the first light sensing pixels into digital light sensing signals, and arranging, comparing, and analyzing the digital light sensing signals.

The first light sensing pixels of the light sensing pixels LSP may have a light transmissivity of about 100% and may sense light of the low luminance range or the low illuminance range. Accordingly, the main driving circuit 200 may convert the light sensing signals generated from the first light sensing pixels into the digital light sensing signals and compare and analyze the digital light sensing signals with a low luminance and low illuminance reference data to detect a luminance value, an illuminance value, and/or the like, for external light of the low luminance range and the low illuminance range in real time.

The second light sensing pixels of the light sensing pixels LPS may have a light transmissivity in a range of about 24% to about 33% and may sense light of the middle luminance range or the middle illuminance range. Accordingly, the main driving circuit 200 may convert light sensing signals generated from the second light sensing pixels into the digital light sensing signals and compare and analyze the digital light sensing signals with preset middle luminance and middle illuminance reference data to detect a luminance value, an illuminance value, and/or the like, for external light of the middle luminance range and the middle illuminance range in real time.

On the other hand, the third light sensing pixels of the light sensing pixels LPS may have a light transmissivity in a range of about 1.1% to about 5.8% and may sense light of the high luminance range or the high illuminance range. Accordingly, the main driving circuit 200 may convert light sensing signals generated from the third light sensing pixels into the digital light sensing signals and compare and analyze the digital light sensing signals with preset high luminance and high illuminance reference data to detect a luminance value, an illuminance value, and/or the like, for external light of the high luminance range and the high illuminance range in real time.

The fourth light sensing pixels of the light sensing pixels LPS may have a light transmissivity in a range of about 0.3% to about 1% and may sense light of the ultra-high luminance range or the ultra-high illuminance range. Accordingly, the main driving circuit 200 may convert light sensing signals generated from the fourth light sensing pixels into the digital light sensing signals and compare and analyze the digital light sensing signals with preset ultra-high luminance and ultra-high illuminance reference data to detect a luminance value, an illuminance value, and/or the like, for external light of the ultra-high luminance range and the ultra-high illuminance range in real time.

Figure 6:
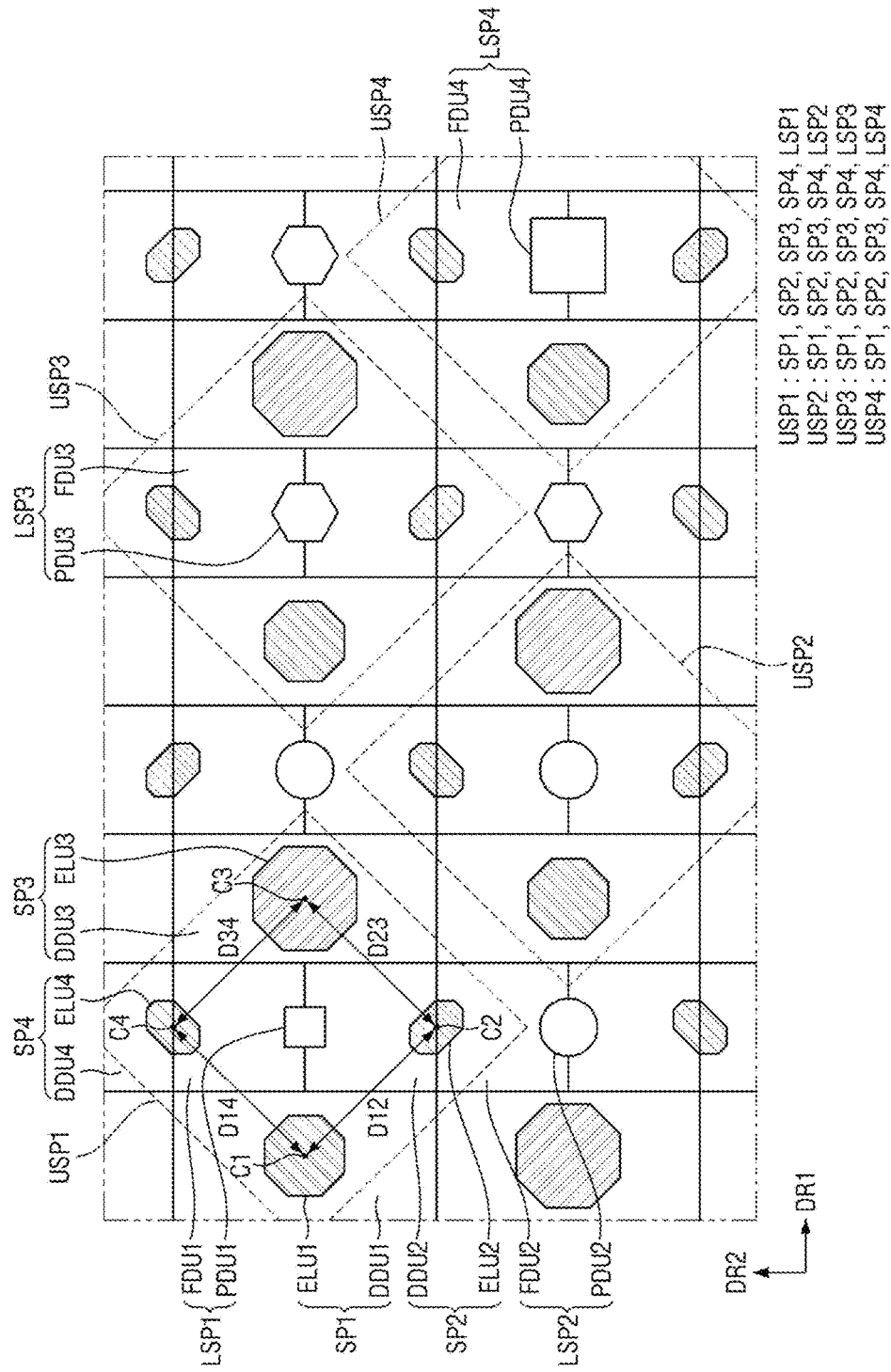
FIG. 6 is a schematic plan view illustrating a layout structure of display pixels and light sensing pixels in a display area according to an embodiment.

FIG. 6 is a schematic plan view illustrating a layout structure of display pixels SP and light sensing pixels LSP1, LSP2, LSP3, and LSP4 in a display area DA according to an embodiment.

Referring to FIG. 6, the display area DA may include first display pixels SP1, second display pixels SP2, third display pixels SP3, fourth display pixels SP4, first light sensing pixels LSP1, second light sensing pixels LSP2, third light sensing pixels LSP3, and fourth light sensing pixels LSP4.

The display pixels SP may be divided into the first display pixels SP1, the second display pixels SP2, the third display pixels SP3, and the fourth display pixels SP4.

The light sensing pixels LSP may be divided into the first light sensing pixels LSP1, the second light sensing pixels LSP2, the third light sensing pixels LSP3, and the fourth light sensing pixels LSP4.

One of the first to fourth light sensing pixels LSP1 to LSP4 and the first to fourth display pixels SP1 to SP4 may constitute one unit pixel. Each unit pixel may be a unit (e.g., a minimum unit) of display pixels that can sense light while displaying white. Each of the unit pixel or the display pixels SP and the light sensing pixels LSP1, LSP2, LSP3, and LSP4 included in the unit pixels may be arranged in the vertical direction or the horizontal direction in a PenTile™ matrix form.

For example, the first to fourth display pixels SP1 to SP4 and the first light sensing pixel LSP1 may constitute a first unit pixel USP1. The first to fourth display pixels SP1 to SP4 and the second light sensing pixel LSP2 may constitute a second unit pixel USP2. The first to fourth display pixels SP1 to SP4 and the third light sensing pixel LSP3 may constitute a third unit pixel USP3. The first to fourth display pixels SP1 to SP4 and the fourth light sensing pixel LSP4 may constitute a fourth unit pixel USP4.

The first to fourth unit pixels USP1 to USP4 may be alternately disposed in the vertical direction and the horizontal direction in the display area DA. The first to fourth unit pixels USP1 to USP4 may be arranged in a PenTile™ matrix form in the display area DA. For example, each of the first to fourth display pixels SP1 to SP4 and one of the first to fourth light sensing pixels LSP1 to LSP1 included in the first to fourth unit pixels USP1 to USP4 may be arranged in the vertical direction or the horizontal direction in a PenTile™ matrix form.

The number of first to fourth unit pixels USP1 to USP4 disposed in a unit area of the display area DA may be in a ratio of 1:3:3:1. For example, in odd-numbered unit pixel rows of the display area DA, the first, second, third, and third unit pixels USP1, USP2, USP3, and USP3 may be alternatively disposed in order of the first, second, third, and third unit pixels USP1, USP2, USP3, and USP3. In even-numbered unit pixel rows of the display area DA, the second, second, third, and fourth unit pixels USP2, USP2, USP3, and USP4 may be alternatively disposed in order of the second, second, third, and fourth unit pixels USP2, USP2, USP3, and USP4.

The first display pixel SP1 may include a first light emitting part ELU1 emitting first light and a first pixel driving part DDU1 for applying a driving current to a light emitting element of the first light emitting part ELU1. The first light may be light of a red wavelength band. For example, a peak wavelength (e.g., a main peak wavelength) of the first light may be positioned in a range of about 600 nm and about 750 nm.

The second display pixel SP2 may include a second light emitting part ELU2 emitting second light and a second pixel driving part DDU2 for applying a driving current to a light emitting element of the second light emitting part ELU2. The second light may be light of a green wavelength band. For example, a peak wavelength (e.g., a main peak wavelength) of the second light may be positioned in a range of about 480 nm and about 560 nm.

The third display pixel SP3 may include a third light emitting part ELU3 emitting third light and a third pixel driving part DDU3 for applying a driving current to a light emitting element of the third light emitting part ELU3. The third light may be light of a blue wavelength band. For example, a peak wavelength (e.g., a main peak wavelength) of the third light may be positioned in a range of about 370 nm and about 460 nm.

The fourth display pixel SP4 may include a fourth light emitting part ELU4 emitting fourth light and a fourth pixel driving part DDU4 for applying a driving current to a light emitting element of the fourth light emitting part ELU4. The fourth light may be light of a green wavelength band like the second light. For example, a peak wavelength (e.g., a main peak wavelength) of the fourth light may be positioned in a range of about 480 nm and about 560 nm.

The first light sensing pixel LSP1 included in the first unit pixel USP1 may include a first light sensing part PDU1 and a first sensing driving part FDU1. The first light sensing part PDU1 of the first light sensing pixel LSP1 may have a light transmissivity of about 100% and sense the light of the low luminance range or the low illuminance range. For example, a front surface of the first light sensing part PDU1 may be in an open state in which a color filter layer, a black matrix layer, or the like, may not be formed on the first light sensing part PDU1, and only a transparent protective layer, protective cover, or the like, may be disposed on the front surface of the first light sensing part PDU1. For example, the low luminance range may be preset to a range of about 0.0005 $cd/m^2$ to about 0.0001 $cd/m^2$, and the first light sensing pixel LSP1 may have a light transmissivity of about 100% and sense the light of the low luminance range.

On the other hand, the second light sensing pixel LSP2 included in the second unit pixel USP2 may include a second light sensing part PDU2 and a second sensing driving part FDU2. The second light sensing part PDU2 of the second light sensing pixel LSP2 may have a light transmissivity in a range of about 24% to about 33% and sense the light of the middle luminance range or the middle illuminance range. For example, a color filter layer of at least one of red, green, and blue colors may be formed on a front surface of the second light sensing part PDU2. For example, red, green, and blue color filter layers may be alternately formed in the vertical direction or the horizontal direction on front surfaces of the second light sensing parts PDU2 arranged in the display area DA. For example, the middle luminance range may be preset to a range of about 0.001 $cd/m^2$ to about 1.2 $cd/m^2$, and the second light sensing pixel LSP2 may have a light transmissivity in a range of about 24% to about 33% and sense the light of the middle luminance range.

The third light sensing pixel LSP3 included in the third unit pixel USP3 may include a third light sensing part PDU3 and a third sensing driving part FDU3. A third light sensing part PDU3 of the third light sensing pixel LSP3 may have a light transmissivity in a range of about 1.1% to about 5.8% and sense the light of the high luminance range or the high illuminance range. For example, color filter layers of at least two of red, green, and blue colors may be doubly formed on a front surface of the third light sensing part PDU3. For example, red and green color filter layers, green and blue color filter layers, or blue and red color filter layers may be formed as double layers on front surfaces of the third light sensing parts PDU3 arranged in the display area DA. For example, the high luminance range may be preset to a range of about 1 $cd/m^2$ to about 100 $cd/m^2$, and the third light sensing pixel LSP3 may have a light transmissivity in a range of about 1.1% to about 5.8% and sense the light of the high luminance range.

The fourth light sensing pixel LSP4 included in the fourth unit pixel USP4 may include a fourth light sensing part PDU4 and a fourth sensing driving part FDU4. A fourth light sensing part PDU4 of the fourth light sensing pixel LSP4 may have a light transmissivity in a range of about 0.3% to about 1% and sense the light of the ultra-high luminance range or the ultra-high illuminance range. For example, a black matrix layer may be formed on a front surface of the fourth light sensing part PDU4. For example, a black matrix layer having a light transmissivity in a range of about 0.3% to about 1% may be formed on front surfaces of the fourth light sensing parts PDU4 arranged in the display area DA. For example, the ultra-high luminance range may be preset to a range of about 200 $cd/m^2$ to about 1000 $cd/m^2$, and the fourth light sensing pixel LSP4 may have a light transmissivity in a range of about 0.3% to about 1% and sense the light of the ultra-high luminance range.

In the first to fourth unit pixel USP1 to USP4, the first to third pixel driving parts DDU1 to DDU3 may be arranged according to an order (e.g., a preset order) in the first direction DR1. In another embodiment, in the first to fourth unit pixel USP1 to USP4, the second and fourth pixel driving parts DDU2 and DDU4 may be arranged in the second direction DR2 with another adjacent pixel driving parts DDU2 and DDU4. In the first to fourth unit pixel USP1 to USP4, the second and fourth pixel driving parts DDU2 and DDU4 may be arranged in the second direction DR2 with one of the first to fourth sensing driving parts FDU1 to FDU4. Each of the first to fourth sensing driving parts FDU1 to FDU4 may be arranged in the first direction DR1 with the first and third pixel driving parts DDU1 and DDU3.

The first pixel driving part DDU1 and the third pixel driving parts DDU3 disposed adjacent to each other in a data line direction may be arranged in the second direction DR2. The second pixel driving parts DDU2 and one of the first to fourth sensing driving parts FDU1 to FDU4 disposed adjacent to each other in a direction of the data line DL (see, e.g., FIG. 5) may be arranged in the second direction DR2. The fourth pixel driving parts DDU4 and one of the first to fourth sensing driving units FDU1 to FDU4 disposed adjacent to each other in the data line DL direction may also be arranged in the second direction DR2.

Due to the arrangement and shapes of the first light emitting part ELU1, the second light emitting part ELU2, the third light emitting part ELU3, and the fourth light emitting part ELU4 in a plan view, a distance D12 between a center C1 of the first light emitting part ELU1 and a center C2 of the second light emitting part ELU2 neighboring to each other, a distance D23 between the center C2 of the second light emitting part ELU2 and a center C3 of the third light emitting part ELU3 neighboring to each other, a distance D34 between the center C3 of the third light emitting part ELU3 and a center C4 of the fourth light emitting part ELU4 neighboring to each other in another direction, and a distance D14 between the center C4 of the fourth light emitting part ELU4 and the center C1 of the first light emitting part ELU1 may be substantially the same.

Figure 7:
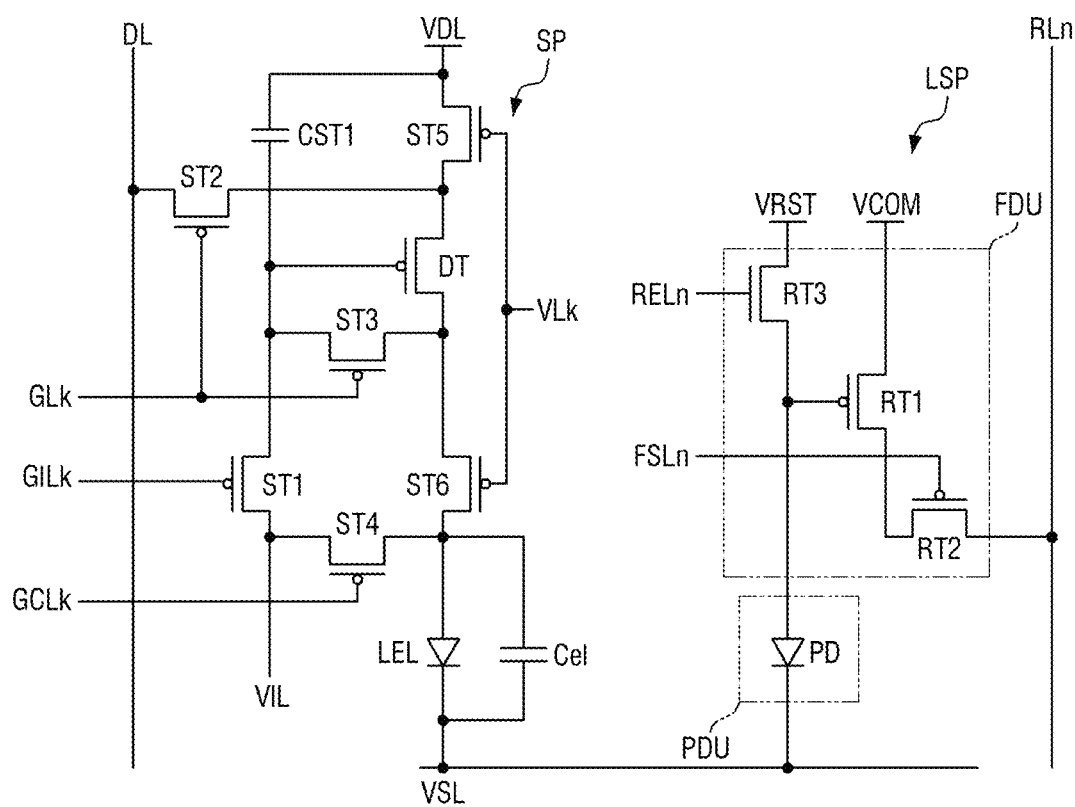
FIG. 7 is a schematic diagram of an equivalent circuit of a display pixel and a light sensing pixel according to an embodiment.

FIG. 7 is a schematic diagram of an equivalent circuit of a display pixel SP and a light sensing pixel LSP according to an embodiment.

Referring to FIG. 7, each display pixel SP according to an embodiment may be connected to a k-th display initialization line GILk, a k-th display scan line GLk, a k-th display control line GCLk, and a k-th emission control line VLK. The display pixel SP may be connected to a first driving voltage line VDL to which a first driving voltage is supplied, a second driving voltage line VSL to which a second driving voltage is supplied, and a third driving voltage line VIL to which a third driving voltage is supplied. Hereinafter, alphabets k and n used instead of numbers may be positive integers excluding about 0.

The display pixel SP may include each light emitting part ELU and each pixel driving part DDU. The light emitting part ELU may include a light emitting element LEL. The pixel driving part DDU may include a driving transistor DT, switch elements, and a capacitor CST1. The switch elements may include first to sixth transistors ST1, ST2, ST3, ST4, ST5, and ST6. The first to sixth transistors ST1, ST2, ST3, ST4, ST5, and ST6 may be first to sixth thin film transistor ST1, ST2, ST3, ST4, ST5, and ST6.

The driving transistor DT may include a gate electrode, a first electrode, and a second electrode. The driving transistor DT may control a drain-source current (hereinafter, referred to as a "driving current") Ids flowing between the first electrode and the second electrode according to a data voltage applied to the gate electrode. The driving current Ids flowing through a channel of the driving transistor DT may be proportional to a square of a difference between a voltage Vsg between the first electrode and the gate electrode and a threshold voltage of the driving transistor DT as represented in Equation 1.

$$Ids = k' \times (Vsg - Vth)^2 \qquad \text{[Equation 1]}$$

k' may be a proportional coefficient determined by a structure and physical characteristics of the driving transistor DT, Vsg may be a voltage between the first electrode and the gate electrode of the driving transistor DT, and Vth may be a threshold voltage of the driving transistor DT.

The light emitting element LEL may emit light according to the driving current Ids. The larger the driving current Ids, the larger the amount of light emitted from the light emitting element LEL.

The light emitting element LEL may be an organic light emitting diode including an organic light emitting layer disposed between an anode electrode and a cathode electrode. In another embodiment, the light emitting element LEL may be an inorganic light emitting element including an inorganic semiconductor disposed between an anode electrode and a cathode electrode. In another embodiment, the light emitting element LEL may be a quantum dot light emitting element including a quantum dot light emitting layer disposed between an anode electrode and a cathode electrode. In another embodiment, the light emitting element LEL may be a micro light emitting element including a micro light emitting diode or a nano light emitting diode disposed between an anode electrode and a cathode electrode.

The anode electrode of the light emitting element LEL may be connected to a first electrode of the fourth transistor ST4 and a second electrode of the sixth transistor ST6, and the cathode electrode of the light emitting element LEL may be connected to the second driving voltage line VSL. A parasitic capacitance Cel may be formed between the anode electrode and the cathode electrode of the light emitting element LEL.

The first transistor ST1 may be turned on by an initialization scan signal of the k-th display initialization line GILk and connect the gate electrode of the driving transistor DT to the third driving voltage line VIL. Accordingly, the third driving voltage VINT of the third driving voltage line VIL may be applied to the gate electrode of the driving transistor DT. A gate electrode of the first transistor ST1 may be connected to the k-th display initialization line GILk, a first electrode of the first transistor ST1 may be connected to the gate electrode of the driving transistor DT, and a second electrode of the first transistor ST1 may be connected to the third driving voltage line VIL.

The second transistor ST2 may be turned on by a display scan signal of the k-th display scan line GLk and connect the first electrode of the driving transistor DT to a data line DL. Accordingly, a data voltage of the data line DL may be applied to the first electrode of the driving transistor DT. A gate electrode of the second transistor ST2 may be connected to the k-th display scan line GLk, a first electrode of the second transistor ST2 may be connected to the first electrode of the driving transistor DT, and a second electrode of the second transistor ST2 may be connected to the data line DL.

The third transistor ST3 may be turned on by the display scan signal of the k-th display scan line GLk and connect the gate electrode and the second electrode of the driving transistor DT to each other. In case that the gate electrode and the second electrode of the driving transistor DT are connected to each other, the driving transistor DT may be driven as a diode. A gate electrode of the third transistor ST3 may be connected to the k-th display scan line GLk, a first electrode of the third transistor ST3 may be connected to the second electrode of the driving transistor DT, and a second electrode of the third transistor ST3 may be connected to the gate electrode of the driving transistor DT.

The fourth transistor ST4 may be turned on by a display control signal of the k-th display control line GCLk and connect the anode electrode of the light emitting element LEL to the third driving voltage line VIL. The third driving voltage of the third driving voltage line VIL may be applied to the anode electrode of the light emitting element LEL. A gate electrode of the fourth transistor ST4 may be connected to the k-th display control line GCLk, the first electrode of the fourth transistor ST4 may be connected to the anode electrode of the light emitting element LEL, and a second electrode of the fourth transistor ST4 may be connected to the third driving voltage line VIL.

The fifth transistor ST5 may be turned on by an emission signal of the k-th emission control line VLK and connect the first electrode of the driving transistor DT to the first driving voltage line VDL. A gate electrode of the fifth transistor ST5 may be connected to the k-th emission control line VLK, a first electrode of the fifth transistor ST5 may be connected to the first driving voltage line VDL, and a second electrode of the fifth transistor ST5 may be connected to the first electrode of the driving transistor DT.

The sixth transistor ST6 may be disposed between the second electrode of the driving transistor DT and the anode electrode of the light emitting element LEL. The sixth transistor ST6 may be turned on by an emission control signal of the k-th emission control line VLk and connect the second electrode of the driving transistor DT to the anode electrode of the light emitting element LEL. A gate electrode of the sixth transistor ST6 may be connected to the k-th emission control line VLK, a first electrode of the sixth transistor ST6 may be connected to the second electrode of the driving transistor DT, and the second electrode of the sixth transistor ST6 may be the anode electrode of the light emitting element LEL.

In case that both the fifth transistor ST5 and the sixth transistor ST6 are turned on, the driving current Ids of the driving transistor DT according to the data voltage applied to the gate electrode of the driving transistor DT may flow to the light emitting element LEL.

The capacitor CST1 may be formed between the gate electrode of the driving transistor DT and the first driving voltage line VDL. A first capacitor electrode of the capacitor CST1 may be connected to the gate electrode of the driving transistor DT, and a second capacitor electrode of the capacitor CST1 may be connected to the first driving voltage line VDL.

In case that the first electrode of each of the first to sixth transistors ST1, ST2, ST3, ST4, ST5, and ST6 and the driving transistor DT is a source electrode, the second electrode of each of the first to sixth transistors ST1, ST2, ST3, ST4, ST5, and ST6 and the driving transistor DT may be a drain electrode. In another embodiment, in case that the first electrode of each of the first to sixth transistors ST1, ST2, ST3, ST4, ST5, and ST6 and the driving transistor DT may be a drain electrode, the second electrode of each of the first to sixth transistors ST1, ST2, ST3. ST4, ST5, and ST6 and the driving transistor DT may be a source electrode.

An active layer of each of the first to sixth transistors ST1, ST2, ST3, ST4, ST5, and ST6 and the driving transistor DT may be formed of one of polysilicon, amorphous silicon, and an oxide semiconductor. FIG. 7 illustrates that the first to sixth transistors ST1, ST2, ST3, ST4, ST5, and ST6, and the driving transistor DT are formed as P-type metal oxide semiconductor field effect transistors (MOSFETs), but the disclosure is not limited thereto. For example, the first to sixth transistors ST1, ST2, ST3, ST4, ST5, and ST6, and the driving transistor DT may also be formed as N-type MOSFETs. In another embodiment, at least one of the first to sixth transistors ST1, ST2, ST3, ST4, ST5, and ST6 may be formed as an N-type MOSFET.

Each of the light sensing pixels LSP may be electrically connected to an n-th sensing reset line RELn, an n-th light sensing scan line FSLn, and an n-th light sensing line RLn. Each of the light sensing pixels LSP may be reset by a reset signal from the n-th sensing reset line RELn and transmit a light sensing signal to each of the n-th light sensing lines RLn in response to a sensing scan signal from the n-th light sensing scan line FSLn.

Each of the light sensing pixels LSP may be divided into a light sensing part PDU including a light sensing element PD and a sensing driving part FDU including first to third sensing transistors RT1 to RT3 and a sensing capacitor (not illustrated). The sensing capacitor may be formed in a parallel structure with the light sensing element PD.

The first sensing transistor RT1 of the sensing driving part FDU may make a light sensing current flow according to a voltage of the light sensing element PD and the sensing capacitor. A current amount of the light sensing current may change according to a voltage applied to the light sensing element PD and the sensing capacitor. A gate electrode of the first sensing transistor RT1 may be connected to a second electrode of the light sensing element PD. A first electrode of the first sensing transistor RT1 may be connected to a common voltage source VCOM to which a common voltage is applied. A second electrode of the first sensing transistor RT1 may be connected to a first electrode of the second sensing transistor RT2.

The second sensing transistor RT2 of the sensing driving part FDU may make the light sensing current of the first sensing transistor RT1 flow to the n-th light sensing line RLn in case that a sensing scan signal of a gate-on voltage is applied to the n-th light sensing line FSLn. The n-th light sensing line RLn may be charged with a sensing voltage by the light sensing current. A gate electrode of the second sensing transistor RT2 may be connected to the n-th light sensing scan line FSLn, the first electrode of the second sensing transistor RT2 may be connected to the second electrode of the first sensing transistor RT1, and a second electrode of the second sensing transistor RT2 may be connected to the n-th light sensing line RLn.

The third sensing transistor RT3 may reset the voltage of the light sensing element PD and the sensing capacitor to a reset voltage of a reset voltage source VRST in case that a reset signal of a gate-on voltage is applied to the n-th sensing reset line RELn. A gate electrode of the third sensing transistor RT3 may be connected to the n-th sensing reset line RELn, a first electrode of the third sensing transistor RT3 may be connected to the reset voltage source VRST, and a second electrode of the third sensing transistor RT3 may be connected to the second electrode of the light sensing element PD.

FIG. 7 illustrates that the first sensing transistor RT1 and the second sensing transistor RT2 are formed as P-type MOSFETs and the third sensing transistor RT3 is formed as an N-type MOSFET, but the disclosure is not limited thereto, and the first to third sensing transistors RT1 to RT3 may be selectively formed as a same type MOSFET or different type MOSFETs. One of the first electrode and the second electrode of each of the first sensing transistor RT1, the second sensing transistor RT2, and the third sensing transistor RT3 may be a source electrode and another of the first electrode and the second electrode of each of the first sensing transistor RT1, the second sensing transistor RT2, and the third sensing transistor RT3 may be a drain electrode.

Figure 8:
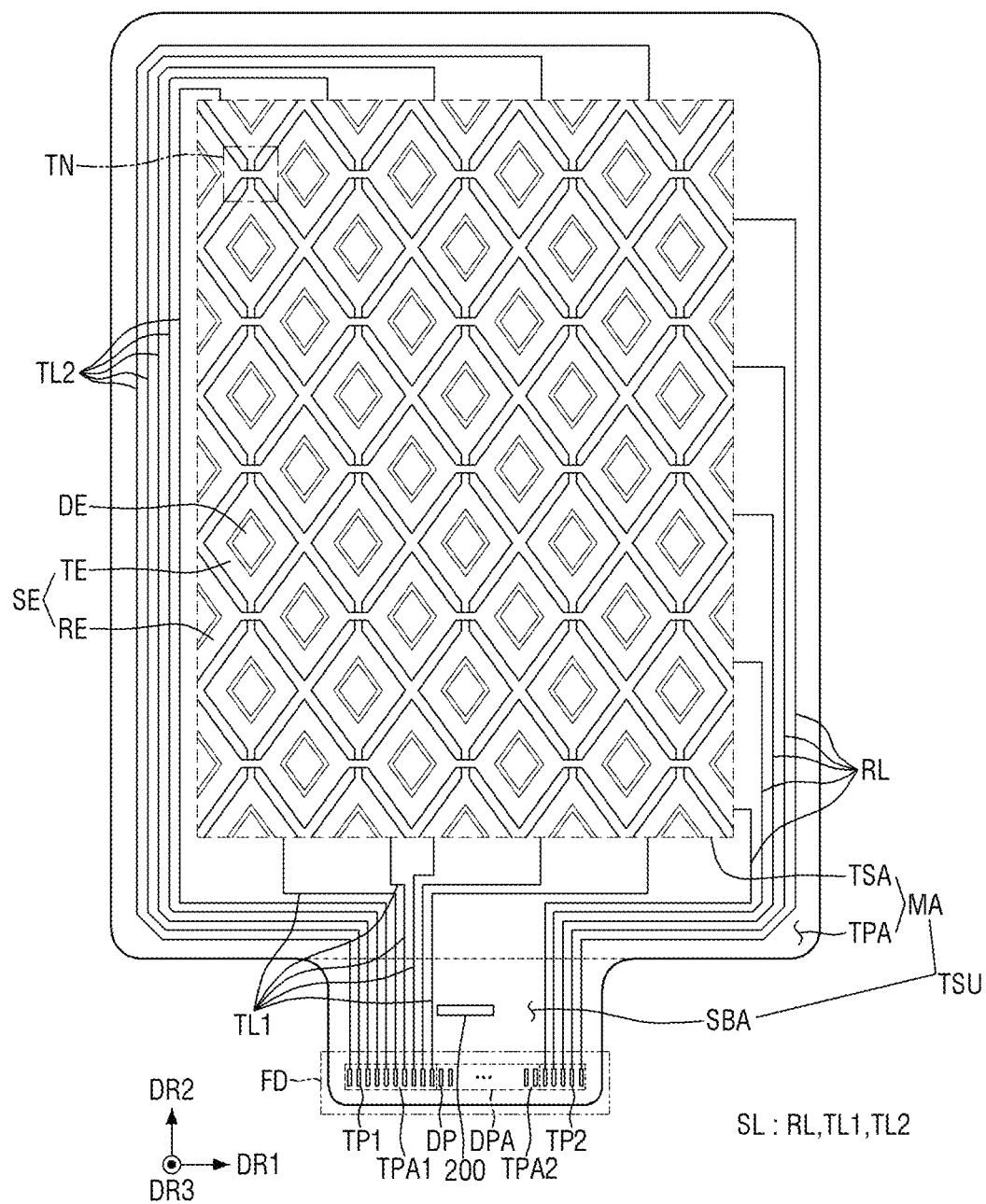
FIG. 8 is a schematic plan view illustrating a touch sensing part of FIG. 4.

FIG. 8 is a schematic plan view illustrating a touch sensing part TSU of FIG. 4.

According to an embodiment, referring to FIG. 8, touch electrodes SE of a main area MA may include two types of electrodes, for example, driving electrodes TE and sensing electrodes RE and may be driven in a mutual capacitive manner of sensing a charge change amount in mutual capacitance of each of multiple touch nodes TN through the sensing electrodes RE after applying touch driving signals to the driving electrodes TE. However, the disclosure is not limited thereto.

In FIG. 8, for convenience of explanation, only the driving electrodes TE, the sensing electrodes RE, dummy electrodes DE, touch lines SL, and first and second touch pads TP1 and TP2 have been illustrated.

The main area MA of the touch sensing part TSU may include a touch sensing area TSA for sensing a user's touch and a touch peripheral area TPA disposed adjacent to (or around) the touch sensing area TSA. The touch sensing area TSA may overlap the display area DA (see, e.g., FIGS. 1 to 3) in a plan view, and the touch peripheral area TPA may overlap the non-display area NDA (see, e.g., FIGS. 1 to 3) in a plan view.

The driving electrodes TE, the sensing electrodes RE, and the dummy electrodes DE may be disposed in the touch sensing area TSA. The driving electrodes TE and the sensing electrodes RE may be electrodes for forming mutual capacitance in order to sense a touch of an object or a person.

The sensing electrodes RE may be arranged in parallel in the first direction DR1 and the second direction DR2. The sensing electrodes RE may be electrically connected to each other in the first direction DR1. The sensing electrodes RE disposed adjacent to each other in the first direction DR1 may be connected to each other. The sensing electrodes RE disposed adjacent to each other in the second direction DR2 may be electrically disconnected from each other. Accordingly, the touch node TN where mutual capacitance is formed may be disposed at each of intersection between the driving electrodes TE and the sensing electrodes RE. The touch nodes TN may correspond to intersections between the driving electrodes TE and the sensing electrodes RE.

The driving electrodes TE may be arranged in parallel in the first direction DR1 and the second direction DR2. The driving electrodes TE disposed adjacent to each other in the first direction DR1 may be electrically disconnected from each other. The driving electrodes TE may be electrically connected to each other in the second direction DR2. The driving electrodes TE disposed adjacent to each other in the second direction DR2 may be connected to each other through a separate connection electrode.

Each of the dummy electrodes DE may be surrounded by the driving electrode TE or the sensing electrode RE. Each of the dummy electrodes DE may be electrically disconnected from the driving electrode TE and the sensing electrode RE. Each of the dummy electrodes DE may be spaced apart from the driving electrode TE and the sensing electrode RE. Each of the dummy electrodes DE may be electrically floated.

FIG. 8 illustrates that each of the driving electrodes TE, the sensing electrodes RE, and the dummy electrodes DE has a rhombic shape in a plan view, but the disclosure is not limited thereto. For example, each of the driving electrodes TE, the sensing electrodes RE, and the dummy electrodes DE may have a rectangular shape other than the rhombic shape, polygonal shapes other than the rectangular shape and the rhombic shape, a circular shape, an elliptical shape, or the like in a plan view.

The touch lines SL may be disposed in the touch peripheral area TPA. The touch lines SL may include first touch driving lines TL1 and second touch driving lines TL2 connected to the driving electrodes TE and touch sensing lines RL connected to the sensing electrodes RE.

The sensing electrodes RE disposed at an end of the touch sensing area TSA may be connected to the touch sensing lines RL in a one-to-one manner. For example, as illustrated in FIG. 8, the sensing electrodes RE disposed at a right end among the sensing electrodes RE electrically connected to each other in the first direction DR1 may be connected to a respective touch sensing line RL. The touch sensing lines RL may be connected to the second touch pads TP2 disposed in a pad part FD in one-to-one manner.

The driving electrodes TE disposed at an end of the touch sensing area TSA may be connected to the first touch driving lines TL1 in a one-to-one manner, and the driving electrodes TE disposed at another end of the touch sensing area TSA may be connected to the second touch driving lines TL2 in a one-to-one manner. For example, the driving electrodes TE disposed at a lower end among the driving electrodes TE electrically connected to each other in the second direction DR2 may be connected to the first touch driving lines TL1, and the driving electrodes TE disposed at an upper end among the driving electrodes TE electrically connected to each other in the second direction DR2 may be connected to the second touch driving lines TL2. The second touch driving lines TL2 may be connected to the driving electrodes TE on the upper end of the touch sensing area TSA via the outer left side of the touch sensing area TSA.

The first touch driving lines TL1 and the second touch driving lines TL2 may be connected to first touch pads TP1 disposed in the pad part FD in a one-to-one manner. The driving electrodes TE may be connected to the first and second touch driving lines TL1 and TL2 on both sides of the touch sensing area TSA and receive touch driving signals. Accordingly, it is possible to prevent a difference between the touch driving signals applied to the driving electrodes TE disposed on the lower end of the touch sensing area TSA and the touch driving signals applied to the driving electrodes TE disposed on the upper end of the touch sensing area TSA from occurring due to an RC delay of the touch driving signals.

Figure 9:
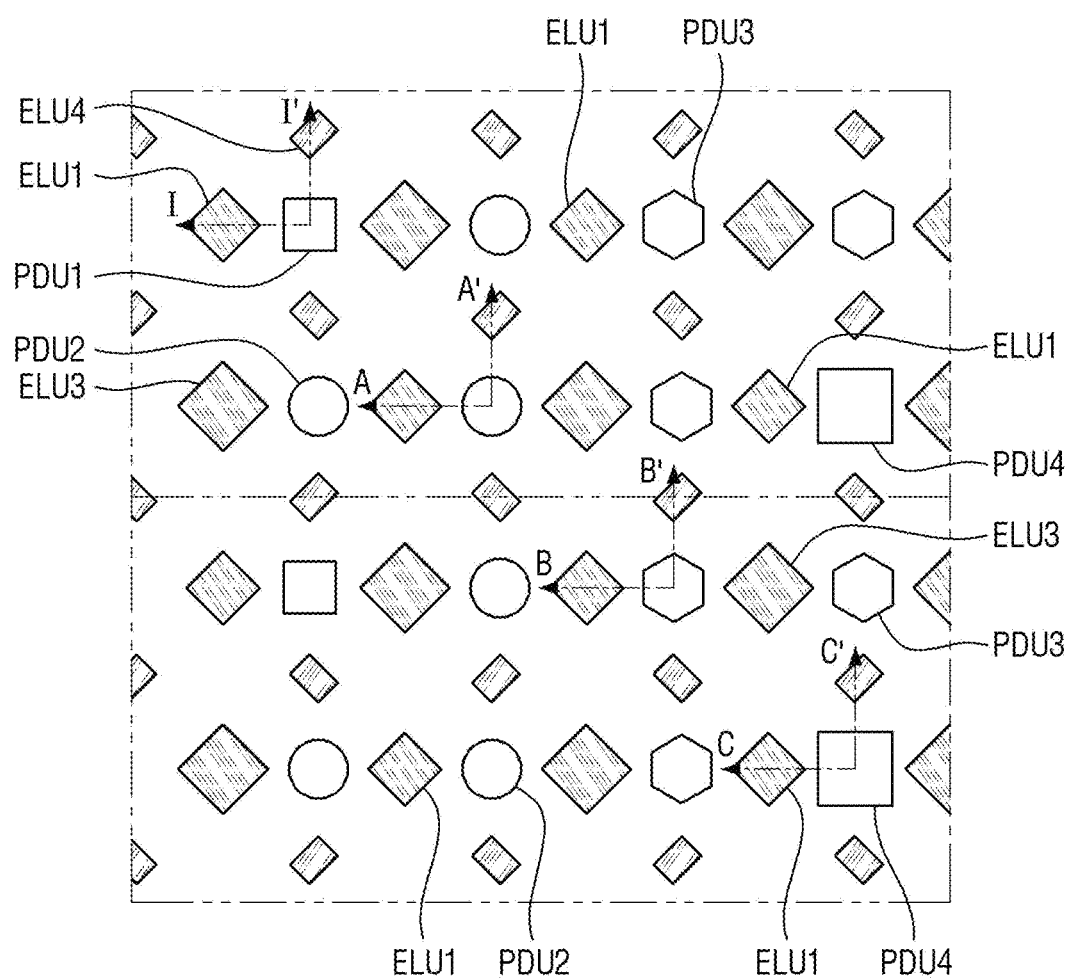
FIG. 9 is a schematic plan view illustrating a layout structure of light emitting parts of display pixels and light sensing parts of light sensing pixels according to an embodiment.

FIG. 9 is a schematic plan view illustrating a layout structure of the first to fourth light emitting parts ELU1 to ELU4 of the display pixels SP and the first to fourth light sensing parts PDU1 to PDU4 of the light sensing pixels LSP according to an embodiment.

Referring to FIG. 9 together with FIG. 6, the number of first to fourth unit pixels USP1 to USP4 disposed in a unit area of the display area DA may be in a ratio of 1:3:3:1.

The first to fourth unit pixels USP1 to USP4 may be arranged in a zigzag pattern in the first direction DR1 in the display area DA. The first to fourth unit pixels USP1 to USP4 may also be arranged in a zigzag pattern in the second direction DR2 in the display area DA. For example, the first to fourth unit pixels USP1 to USP4 may be disposed in a PenTile™ matrix structure. The first to fourth unit pixels USP1 to USP4 may be disposed adjacent to each other in a diagonal direction in the display area DA, and be arranged in the zigzag pattern in the first direction DR1 and the second direction DR2.

In the PenTile™ matrix structure, the first to third unit pixels USP1 to USP3 of the first to fourth unit pixels USP1 to USP4 arranged in the zigzag pattern in the first direction DR1 in the display area DA may be alternately disposed in order of the first, second, third, and third unit pixels USP1, USP2, USP3, and USP3. For example, the third unit pixels USP3 may be repeatedly disposed, such that the first to third unit pixels USP1 to USP3 is disposed in order of the first, second, third, and third unit pixels USP1, USP2, USP3, and USP3 in the first direction DR1 in the display area DA. Accordingly, the first light sensing part PDU1 of the first unit pixel USP1, the second light sensing part PDU2 of the second light sensing pixel LSP2, the third light sensing part PDU3 of the third light sensing pixel LSP3, and the third light sensing part PDU3 of the third light sensing pixel LSP3 may be repeatedly disposed in odd-numbered unit pixel rows of the display area DA in a zigzag pattern in the first direction DR1.

The second to fourth unit pixels USP2 to USP4 of the first to fourth unit pixels USP1 to USP4 arranged in the zigzag pattern in the first direction DR1 in the display area DA may be alternately disposed in order of the second, second, third, and fourth unit pixels USP2, USP2, USP3, and USP4. Accordingly, the second light sensing part PDU2 of the second light sensing pixel LSP2, the second light sensing part PDU2 of the second light sensing pixel LSP2, the third light sensing part PDU3 of the third light sensing pixel LSP3, and the fourth light sensing part PDU4 of the fourth light sensing pixel LSP4 may be repeatedly disposed in even-numbered unit pixel rows of the display area DA in a zigzag pattern in the first direction DR1.

Each of the first light emitting part ELU1, the second light emitting part ELU2, the third light emitting part ELU3, and the fourth light emitting part ELU4 may have a rectangular shape, an octagonal shape, or a rhombic shape in a plan view, but the disclosure is limited thereto. Each of the first light emitting part ELU1, the second light emitting part ELU2, the third light emitting part ELU3, and the fourth light emitting part ELU4 may have polygonal shapes other than the rectangular shape, the octagonal shape, and the rhombic shape, or the like in a plan view. Sizes, diameters, areas, and the like, of the first light emitting part ELU1, the second light emitting part ELU2, the third light emitting part ELU3, and the fourth light emitting part ELU4 in a plan view may be different from each other.

Each of the first light sensing part PDU1, the second light sensing part PDU2, the third light sensing part PDU3, and the third light sensing part PDU3 may have a polygonal shape such as a rectangular shape, a hexagonal shape, an octagonal shape, a rhombic shape, or the like in a plan view, but the disclosure is not limited thereto. Each of the first light emitting part ELU1, the second light emitting part ELU2, the third light emitting part ELU3, and the fourth light emitting part ELU4 may have a circular shape, a semi-circular shape, other than the rectangular shape, the octagonal shape, and the rhombic shape, or the like in a plan view. Sizes, diameters, areas, and the like, of the first light sensing part PDU1, the second light sensing part PDU2, the third light sensing part PDU3, and the third light sensing part PDU3 in a plan view may be different from each other.

Figure 10:
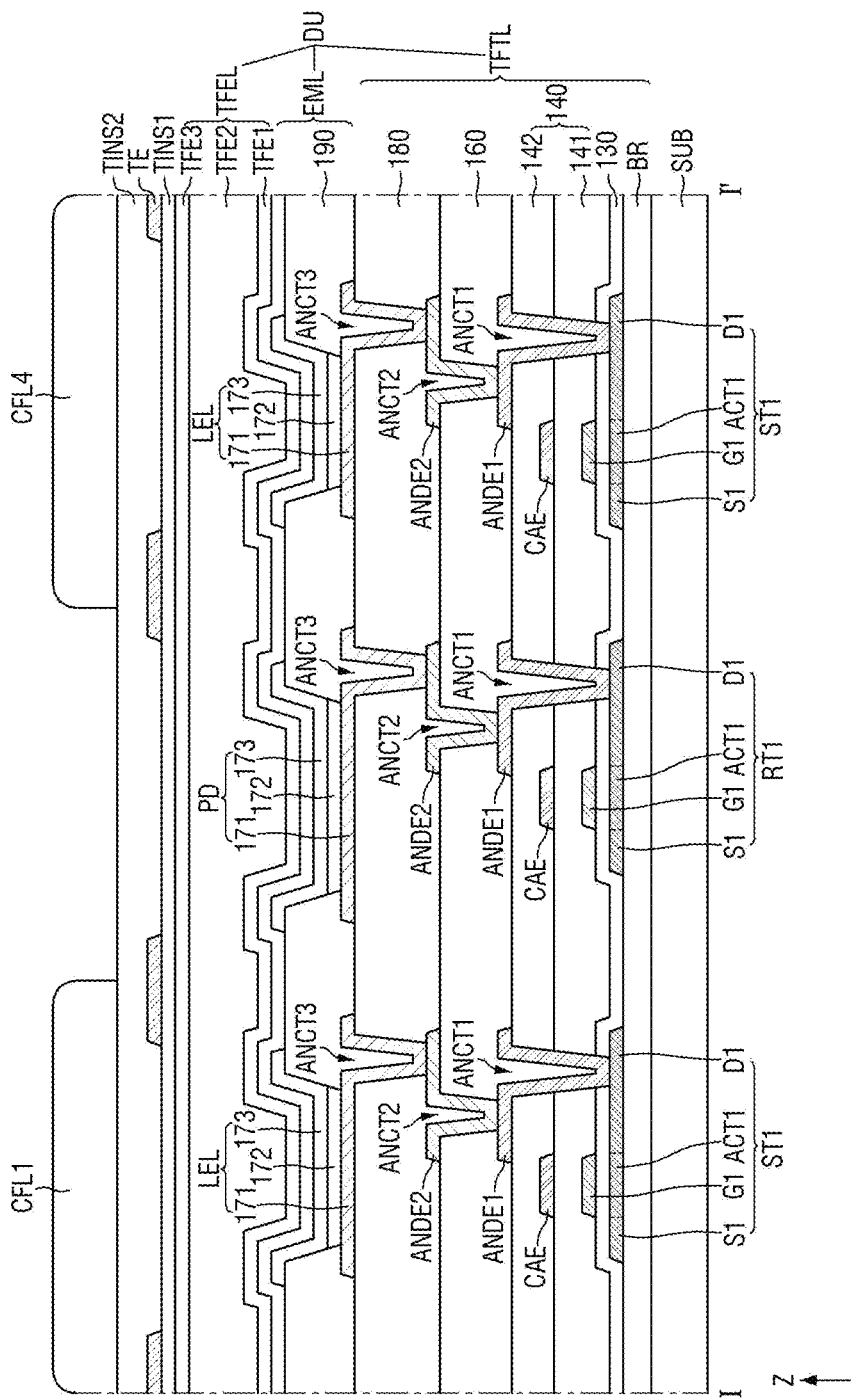
FIG. 10 is a schematic cross-sectional view illustrating a cross-sectional structure taken along line I-I' of FIG. 9.
Figure 11:
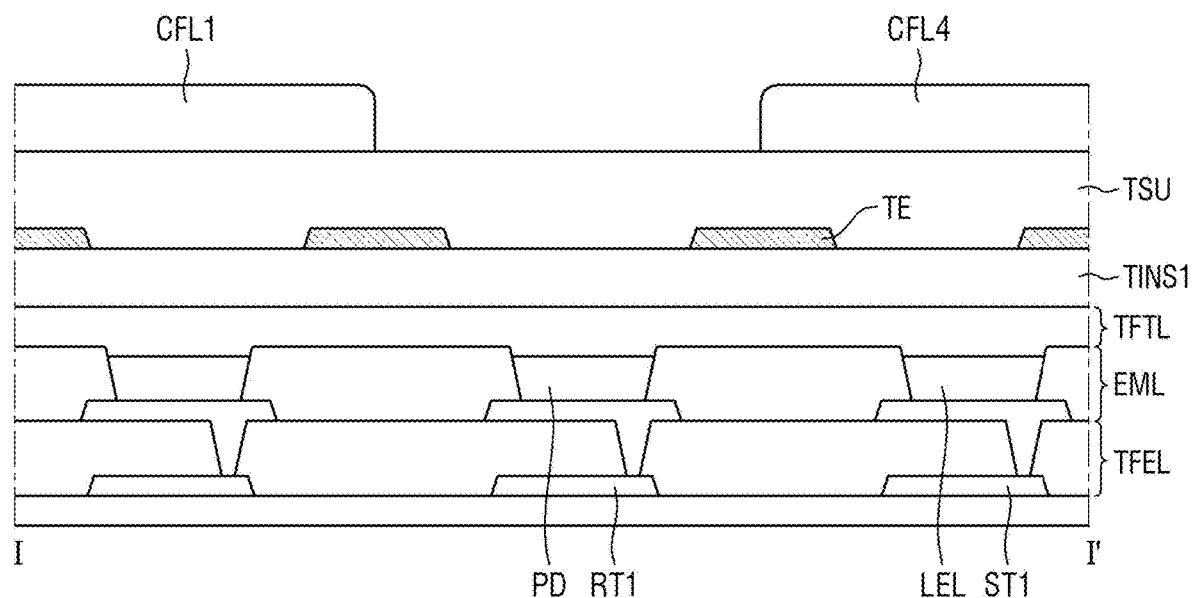
FIG. 11 is a schematic cross-sectional view illustrating a cross-sectional structure taken along line I-I' of FIG. 10 in a simplified block form.

FIG. 10 is a schematic cross-sectional view illustrating a cross-sectional structure taken along line I-I' of FIG. 9. FIG. 11 is a schematic cross-sectional view illustrating a cross-sectional structure taken along line I-I' of FIG. 10 in a simplified block form.

Referring to FIGS. 10 and 11, a barrier layer BR may be disposed on a substrate SUB. The substrate SUB may be made of an insulating material such as a polymer resin or the like. For example, the substrate SUB may be made of polyimide. The substrate SUB may be a flexible substrate that is bendable, foldable, rollable, or the like.

The barrier layer BR may be a film for protecting transistors of a thin film transistor layer TFTL and light emitting layers 172 of a light emitting element layer EML from moisture or the like permeating through the substrate SUB vulnerable to moisture permeation. The barrier layer BR may include multiple inorganic layers that are alternately stacked each other. For example, the barrier layer BR may be formed as multiple layers in which one or more inorganic layers of a silicon nitride layer, a silicon oxynitride layer, a silicon oxide layer, a titanium oxide layer, and an aluminum oxide layer are alternately stacked each other.

The first to sixth transistors ST1, ST2, ST3, ST4, ST5, and ST6 of the first to fourth pixel driving parts DDU1 to DDU4 and the first and second sensing transistors RT1 and RT2 of the first to fourth sensing driving parts FDU1 to FDU4 may be disposed on the barrier layer BR. Each of the thin film transistors and the sensing transistors may include an active layer ACT1, a gate electrode G1, a source electrode S1, and a drain electrode D1.

The active layer ACT1, the source electrode S1, and the drain electrode D1 of each of the thin film transistors and the sensing transistors may be disposed on the barrier layer BR. The active layer ACT1 of the first thin film transistor ST1 may include polycrystalline silicon, single crystal silicon, low-temperature polycrystalline silicon, amorphous silicon, an oxide semiconductor, the like, or a combination thereof. The active layer ACT1 overlapping the gate electrode G1 in the third direction (Z-axis direction), which is a thickness direction of the substrate SUB, may be a channel region. The source electrode S1 and the drain electrode D1 may be regions not overlapping the gate electrode G1 in the third direction (Z-axis direction) and have conductivity by doping a silicon semiconductor, an oxide semiconductor, or the like with ions, impurities, the like, or a combination thereof.

For example, a gate insulating layer 130 may be disposed on the active layer ACT1, the source electrode S1, and the drain electrode D1 of the first thin film transistor ST1. The gate insulating layer 130 may be formed as an inorganic layer such as a silicon nitride layer, a silicon oxynitride layer, a silicon oxide layer, a titanium oxide layer, an aluminum oxide layer, or the like.

The gate electrode G1 of the first thin film transistor ST1 may be disposed on the gate insulating layer 130. The gate electrode G1 may overlap the active layer ACT1 in the third direction (Z-axis direction). The gate electrode G1 may be formed as a single layer or multiple layers including molybdenum (Mo), aluminum (Al), chromium (Cr), gold (Au), titanium (Ti), nickel (Ni), neodymium (Nd), copper (Cu), or an alloy thereof.

An interlayer insulating layer 140 may include a first interlayer insulating layer 141 and a second interlayer insulating layer 142. The first interlayer insulating layer 141 may be disposed on the gate electrode G1 of the first thin film transistor ST1. The first interlayer insulating layer 141 may be formed as an inorganic layer such as a silicon nitride layer, a silicon oxynitride layer, a silicon oxide layer, a titanium oxide layer, an aluminum oxide layer, the like, or a combination thereof. The first interlayer insulating layer 141 may be formed as multiple inorganic layers.

Capacitor electrodes CAE may be disposed on the first interlayer insulating layer 141. The capacitor electrode CAE may overlap the gate electrode G1 of the first thin film transistor ST1 in the third direction (Z-axis direction). Since the first interlayer insulating layer 141 has a dielectric constant (e.g., a predetermined or selectable dielectric constant), a capacitor may be formed by the capacitor electrode CAE, the gate electrode G1, and the first interlayer insulating layer 141 disposed between the capacitor electrode CAE and the gate electrode G1. The capacitor electrode CAE may be formed as a single layer or multiple layers including molybdenum (Mo), aluminum (Al), chromium (Cr), gold (Au), titanium (Ti), nickel (Ni), neodymium (Nd), and copper (Cu), or an alloy thereof.

The second interlayer insulating layer 142 may be disposed on the capacitor electrode CAE. The second interlayer insulating layer 142 may be formed as an inorganic layer such as a silicon nitride layer, a silicon oxynitride layer, a silicon oxide layer, a titanium oxide layer, an aluminum oxide layer, the like, or a combination thereof. The second interlayer insulating layer 142 may be formed as multiple inorganic layers.

First anode connection electrodes ANDE1 may be disposed on the second interlayer insulating layer 142. The first anode connection electrode ANDE1 may be connected to the drain electrode D1 of the first thin film transistor ST1 through a first connection contact hole ANCT1 penetrating through the gate insulating layer 130, the first interlayer insulating layer 141, and the second interlayer insulating layer 142. The first anode connection electrode ANDE1 may be formed as a single layer or multiple layers including molybdenum (Mo), aluminum (Al), chromium (Cr), gold (Au), titanium (Ti), nickel (Ni), neodymium (Nd), and copper (Cu), or an alloy thereof.

A first planarization layer 160 for planarizing a step due to the first thin film transistor ST1 may be disposed on the first anode connection electrode ANDE1. The first planarization layer 160 may be formed as an organic layer including an acrylic resin, an epoxy resin, a phenolic resin, a polyamide resin, a polyimide resin, the like, or a combination thereof.

Second anode connection electrodes ANDE2 may be disposed on the first planarization layer 160. The second anode connection electrode ANDE2 may be connected to the first anode connection electrode ANDE1 through a second connection contact hole ANCT2 penetrating through the first planarization layer 160. The second anode connection electrode ANDE2 may be formed as a single layer or multiple layers including molybdenum (Mo), aluminum (Al), chromium (Cr), gold (Au), titanium (Ti), nickel (Ni), neodymium (Nd), and copper (Cu), or an alloy thereof.

A second planarization layer 180 may be disposed on the second anode connection electrodes ANDE2. The second planarization layer 180 may be formed as an organic layer including an acrylic resin, an epoxy resin, a phenolic resin, a polyamide resin, a polyimide resin, the like, or a combination thereof.

Light emitting elements LEL and a bank 190 may be disposed on the second planarization layer 180. Each of the light emitting elements LEL may include a pixel electrode 171, a light emitting layer 172, and a common electrode 173.

The pixel electrode 171 may be disposed on the second planarization layer 180. The pixel electrode 171 may be connected to the second anode connection electrode ANDE2 through a third connection contact hole ANCT3 penetrating through the second planarization layer 180.

In a top emission structure in which light is emitted toward the common electrode 173 based on the light emitting layer 172, the pixel electrode 171 may be formed of a metal material having high reflectivity, such as a stacked structure (Ti/Al/Ti) of aluminum and titanium, a stacked structure (ITO/Al/ITO) of aluminum and indium tin oxide (ITO), an APC alloy, a stacked structure (ITO/APC/ITO) of an APC alloy and ITO, and the like. The APC alloy may be an alloy of silver (Ag), palladium (Pd), and copper (Cu).

The bank 190 may partition the pixel electrodes 171 and formed on the second planarization layer 180 in order to define the first to fourth light emitting parts ELU1 to ELU4 and the first to fourth light sensing parts PDU1 to PDU4. The bank 190 may cover edges of the pixel electrodes 171. The bank 190 may be formed as an organic layer including an acrylic resin, an epoxy resin, a phenolic resin, a polyamide resin, a polyimide resin, the like, or a combination thereof.

Each of the first to third light emitting parts ELU1 to ELU4 may be an area in which the pixel electrode 171, the light emitting layer 172, and the common electrode 173 are sequentially stacked and holes from the pixel electrode 171 and electrons from the common electrode 173 are combined with each other in the light emitting layer 172 and emit light. In contrast, each of the first to fourth light sensing parts PDU1 to PDU4 may be a light sensing element PD in which the pixel electrode 171, the light emitting layer 172, and the common electrode 173 are sequentially stacked.

The light emitting layer 172 may be disposed on the pixel electrode 171 and the bank 190. In the light sensing element PD, the light emitting layer 172 may be used as a light sensing layer including an organic material.

The light emitting layer 172 or the light sensing layer may include a hole transporting layer, an organic material layer, and an electron transporting layer.

The common electrode 173 may be disposed on the light emitting layer 172 and the light sensing layer. The common electrode 173 may cover the light emitting layer 172. The common electrode 173 may be a common layer formed in common in the first to fourth light emitting parts ELU1 to ELU4 and the first to fourth light sensing parts PDU1 to PDU4. A capping layer may be formed on the common electrode 173.

In the top emission structure, the common electrode 173 may be formed of a transparent conductive material (TCO) such as ITO, indium zinc oxide (IZO), the like, or a combination thereof capable of transmitting light through the common electrode 173 or a semi-transmissive conductive material such as magnesium (Mg), silver (Ag), the like, or an alloy thereof. In case that the common electrode 173 is formed of the semi-transmissive conductive material, emission efficiency may be increased by a micro cavity.

An encapsulation layer TFEL may be disposed on the common electrode 173. The encapsulation layer TFEL may include at least one inorganic layer in order to prevent oxygen, moisture, or the like from permeating into the light emitting element layer EML. The encapsulation layer TFEL may include at least one organic layer in order to protect the light emitting element layer EML from foreign materials such as dust or the like. For example, the encapsulation layer TFEL may include a first encapsulation inorganic layer TFE1, an encapsulation organic layer TFE2, and a second encapsulation inorganic layer TFE3.

The first encapsulation inorganic layer TFE1 may be disposed on the common electrode 173, the encapsulation organic layer TFE2 may be disposed on the first encapsulation inorganic layer TFE1, and the second encapsulation inorganic layer TFE3 may be disposed on the encapsulation organic layer TFE2. The first encapsulation inorganic layer TFE1 and the second encapsulation inorganic layer TFE3 may be formed as multiple layers in which one or more inorganic layers of a silicon nitride layer, a silicon oxynitride layer, a silicon oxide layer, a titanium oxide layer, and an aluminum oxide layer are alternately stacked each other. The encapsulation organic layer TFE2 may be an organic layer including an acrylic resin, an epoxy resin, a phenolic resin, a polyamide resin, a polyimide resin, the like, or a combination thereof.

A touch sensing part TSU may be disposed on the encapsulation layer TFEL. The touch sensing part TSU may include a first touch insulating layer TINS1, driving electrodes TE, sensing electrodes RE, a light blocking pattern layer BCP, connection electrodes CE, and a second touch insulating layer TINS2.

The first touch insulating layer TINS1 may be formed as an inorganic layer such as a silicon nitride layer, a silicon oxynitride layer, a silicon oxide layer, a titanium oxide layer, an aluminum oxide layer, the like, or a combination thereof.

The driving electrodes TE and the sensing electrodes RE may be disposed on the first touch insulating layer TINS1. The dummy electrodes DE, the first touch driving lines TL1, the second touch driving lines TL2, and the touch sensing lines RL illustrated in FIG. 8 as well as the driving electrodes TE and the sensing electrodes RE may be disposed on the first touch insulating layer TINS1.

The driving electrodes TE, the sensing electrodes RE, and the dummy electrodes DE may be formed as conductive metal electrodes including molybdenum (Mo), aluminum (Al), chromium (Cr), gold (Au), titanium (Ti), nickel (Ni), neodymium (Nd), and copper (Cu), or an alloy thereof. The driving electrodes TE, the sensing electrodes RE, and the dummy electrodes DE may be formed in a mesh structure or a net structure and not overlap emission areas EA1 to EA4 in the third direction (Z-axis direction). Each driving electrode TE and sensing electrode RE may partially overlap the connection electrode CE in the third direction (Z-axis direction).

The second touch insulating layer TINS2 may be formed on the driving electrodes TE and the sensing electrodes RE. The second touch insulating layer TINS2 may planarize a step formed due to the driving electrodes TE, the sensing electrodes RE, and the connection electrodes CE. For example, the second touch insulating layer TINS2 may be formed as an inorganic layer such as a silicon nitride layer, a silicon oxynitride layer, a silicon oxide layer, a titanium oxide layer, an aluminum oxide layer, the like, or a combination thereof. In another embodiment, the second touch insulating layer TINS2 may be formed as an organic layer including an acrylic resin, an epoxy resin, a phenolic resin, a polyamide resin, a polyimide resin, the like, or a combination thereof.

A black matrix layer (not illustrated) may be patterned on the touch sensing part TSU, and multiple color filter layers may be formed on the touch sensing part TSU including the black matrix layer.

Referring to FIG. 10, a first color filter layer CFL1 of a red color may be formed on the first light emitting part ELU1, and a fourth color filter layer CFL4 of a green color may be formed on the fourth light emitting part ELU4. For example, first to fourth color filter layers (see, e.g., CFL1 to CFL4 of FIGS. 11 and 12) may be formed in a planar shape on the second touch insulating layer TINS2 corresponding to the first to fourth light emitting parts ELU1 to ELU4, respectively.

The first light sensing part PDU1 of the first light sensing pixel LSP1 included in the first unit pixel USP1 may have the light transmissivity of about 100% so as to sense the light of the low luminance range or the low illuminance range. To this end, a color filter layer or a black matrix layer may be not formed on a front surface of the first light sensing part PDU1, and only a transparent protective layer, protective cover, or the like, may be disposed on the front surface of the first light sensing part PDU1.

Figure 12:
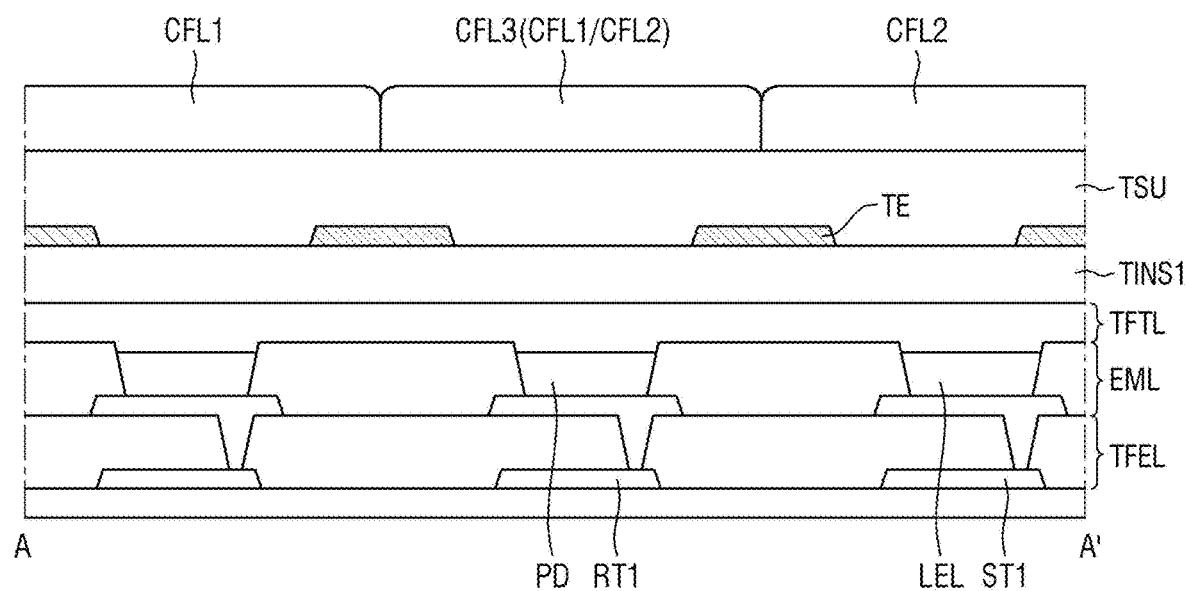
FIG. 12 is a schematic cross-sectional view illustrating a cross-sectional structure taken along line A-A' of FIG. 9 in a simplified block form.

FIG. 12 is a schematic cross-sectional view illustrating a cross-sectional structure taken along line A-A' of FIG. 9 in a simplified block form.

Referring to FIG. 12, a black matrix layer (not illustrated) may be patterned on the touch sensing part TSU, and multiple color filter layers may be formed on the touch sensing part TSU including the black matrix layer.

The first color filter layer CFL1 of the red color may be formed on the first light emitting part ELU1 of the first display pixel SP1. A second color filter layer CFL2 of a green color may be formed on the second light emitting part ELU2 of the second display pixel SP2. For example, first to fourth color filter layers may be disposed in a planar shape on the first to fourth light emitting parts ELU1 to ELU4 corresponding to the first to fourth light emitting parts ELU1 to ELU4, respectively. On the other hand, a color filter layer of one of red, green, and blue colors (e.g., the third color filter layer CFL3) of the first to third color filter layers CFL1 to CFL3 may be formed on the second light sensing part PDU2 of the second light sensing pixel LSP2 included in the second unit pixel USP2.

The second light sensing part PDU2 of the second light sensing pixel LSP2 included in the second unit pixel USP2 may have a light transmissivity in a range of about 24% to about 33% in order to sense the light of the middle luminance range or the middle illuminance range. To this end, first to third color filter layers CFL1 to CFL3 of red, green, and blue colors may be alternately and repeatedly formed in a vertical direction or a horizontal direction on front surfaces of the second light sensing parts PDU2 arranged in the display area DA.

FIG. 12 illustrates that a third color filter layer CFL3 of a blue color is disposed on the second light sensing part PDU2 of the second light sensing pixel LSP2. However, the disclosure is not limited thereto, and first and second color filter layers CFL1 and CFL2 of a red or green colors having a light transmissivity in a range of about 24% to about 33% may also be formed on the second light sensing part PDU2 of the second light sensing pixel LSP2.

Figure 13:
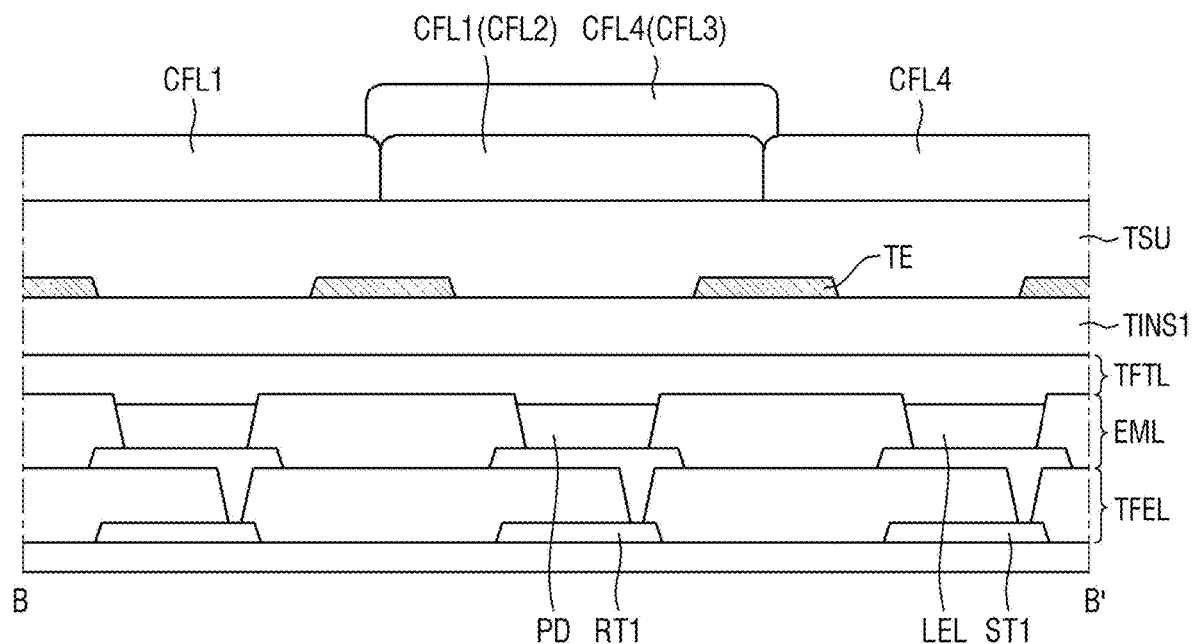
FIG. 13 is a schematic cross-sectional view illustrating a cross-sectional structure taken along line B-B' of FIG. 9 in a simplified block form.

FIG. 13 is a schematic cross-sectional view illustrating a cross-sectional structure taken along line B-B' of FIG. 9 in a simplified block form.

Referring to FIG. 13, a black matrix layer (not illustrated) may be patterned on the touch sensing part TSU, and multiple color filter layers may be formed on the touch sensing part TSU including the black matrix layer.

A first color filter layer CFL1 of a red color may be formed on the first light emitting part ELU1 of the first display pixel SP1. A fourth color filter layer CFL4 of a green color may be formed on the fourth light emitting part ELU4 of the fourth display pixel SP4. For example, first to fourth color filter layers CFL1 to CFL4 may be disposed in a planar shape on the first to fourth light emitting parts ELU1 to ELU4 corresponding to the first to fourth light emitting parts ELU1 to ELU4, respectively. On the other hand, color filter layers of two of red, green, and blue colors, for example, the first and second color filter layers CFL1 and CFL2 of the first to third color filter layers CFL1 to CFL3 may be formed as double layers on the third light sensing part PDU3 of the third light sensing pixel LSP3 included in the third unit pixel USP3. The third light sensing part PDU3 of the third light sensing pixel LSP3 included in the third unit pixel USP3 may have a light transmissivity in a range of about 1.1% to about 5.8% in order to sense the light of the high luminance range or the high illuminance range. To this end, first and second color filter layers CFL1 and CFL2 of red and green colors, second and third color filter layers CFL2 and CFL3 of green and blue colors, or third and first color filter layers CFL3 and CFL1 of blue and red colors may be formed as double layers on front surfaces of the third light sensing parts PDU3 arranged in the display area DA.

FIG. 13 illustrates that first and fourth color filter layers CFL1 and CFL4 of red and green colors are disposed on the third light sensing part PDU3 of the third light sensing pixel LSP3. However, the disclosure is not limited thereto, and second and third color filter layers CFL2 and CLF3 of green and blue colors or third and first color filter layers CFL3 and CFL1 of blue and red colors having a light transmissivity in a range of about 1.1% to about 5.8% may be formed as double layers on the third light sensing part PDU3 of the third light sensing pixel LSP3.

Figure 14:
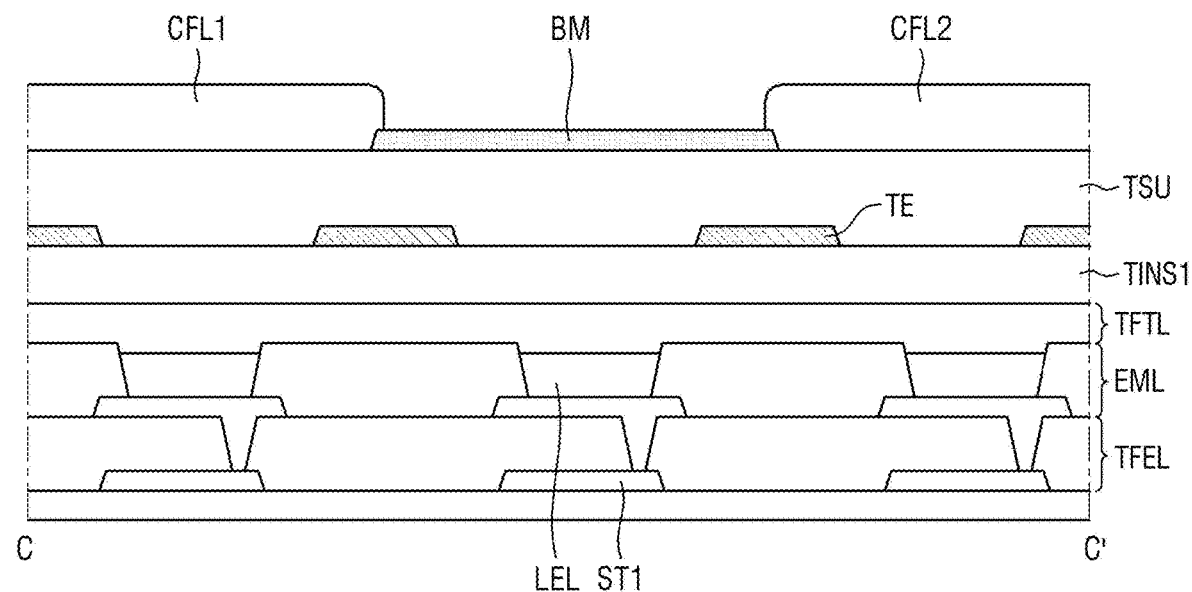
FIG. 14 is a schematic cross-sectional view illustrating a cross-sectional structure taken along line C-C' of FIG. 9 in a simplified block form.

FIG. 14 is a schematic cross-sectional view illustrating a cross-sectional structure taken along line C-C' of FIG. 9 in a simplified block form.

Referring to FIG. 14, a black matrix layer (not illustrated) may be patterned on the touch sensing part TSU, and multiple color filter layers may be formed on the touch sensing part TSU including the black matrix layer.

A red first color filter layer CFL1 may be formed on the first light emitting part ELU1 of the first display pixel SP1. A green second color filter layer CFL2 may be formed on the second light emitting part ELU2 of the second display pixel SP2. On the other hand, a black matrix layer BM may be formed on the fourth light sensing part PDU4 of the fourth light sensing pixel LSP4 included in the fourth unit pixel USP4. The fourth light sensing part PDU4 of the fourth light sensing pixel LSP4 included in the fourth unit pixel USP4 may have a light transmissivity in a range of about 0.3% to about 1% in order to sense the light of the ultra-high luminance range or the ultra-high illuminance range. To this end, the black matrix layer BM having a light transmissivity in a range of about 0.3% to about 1% may be formed on front surfaces of the fourth light sensing parts PDU4 arranged in the display area DA.

Figure 15:
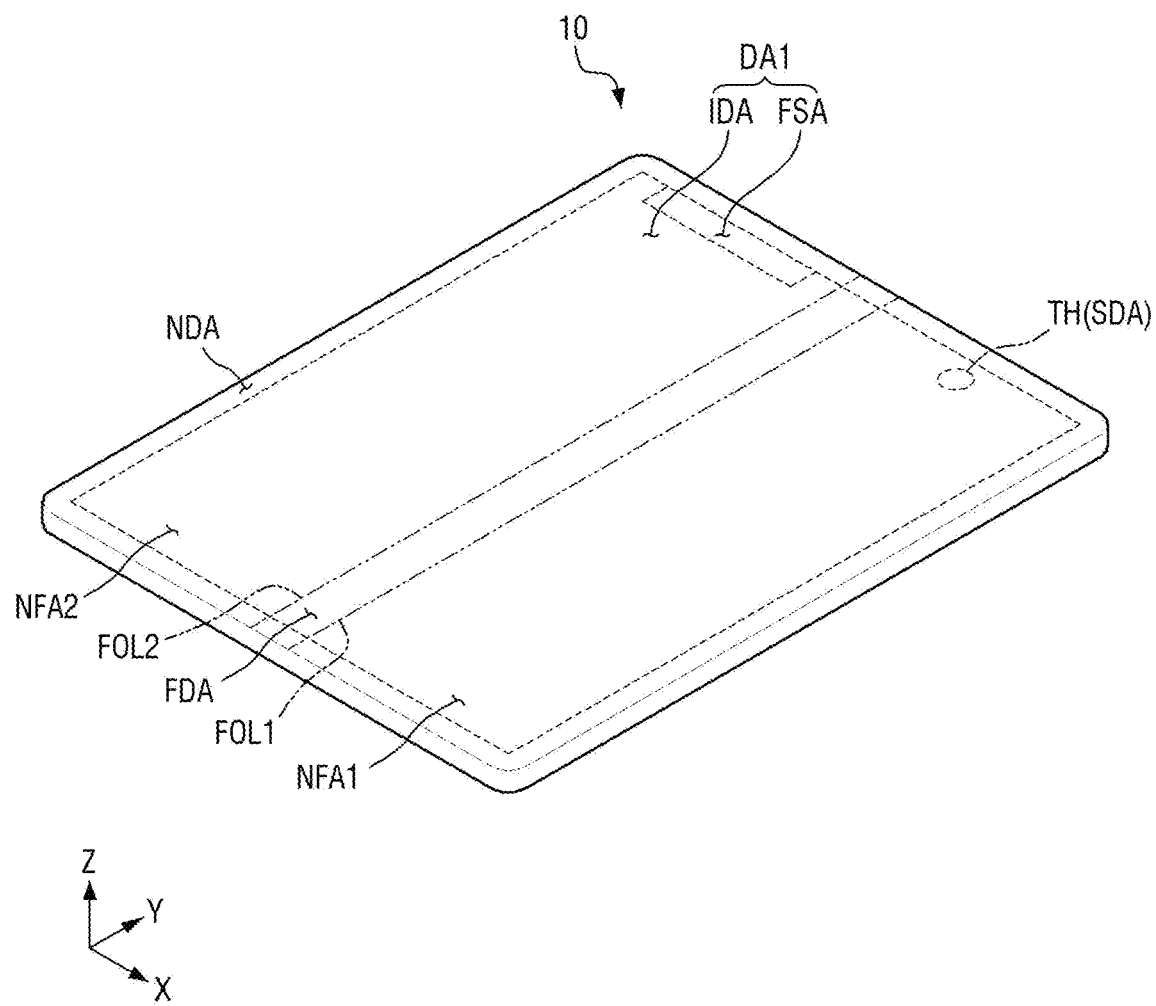
FIGS. 15 and 16 are schematic perspective views illustrating a display device according to another embodiment.
Figure 16:
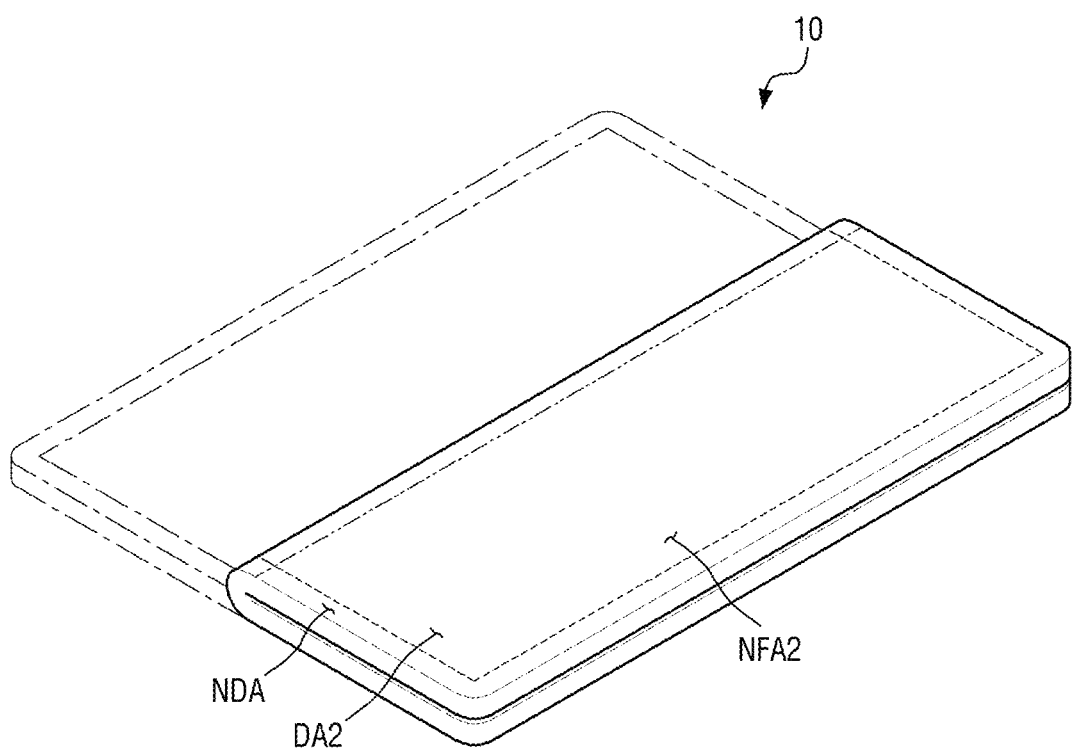

FIGS. 15 and 16 are schematic perspective views illustrating a display device 10 according to another embodiment.

FIGS. 15 and 16 illustrate that a display device 10 is a foldable display device that is bendable or foldable in a first direction (X-axis direction). The display device 10 may be maintained in both a folded state and an unfolded state. The display device 10 may be folded in an in-folding manner in which a front surface of the display device 10 is disposed inside. In case that the display device 10 is bent or folded in the in-folding manner, front surfaces (or top surfaces) of the display device 10 may face each other. In another embodiment, the display device 10 may be folded in an out-folding manner in which a front surface of the display device 10 is disposed outside. In case that the display device 10 is bent or folded in the out-folding manner, rear surfaces (or bottom surfaces) of the display device 10 may face each other.

A first non-folding area NFA1 may be disposed on a side, for example, a right side of a folding area FDA. A second non-folding area NFA2 may be disposed on another side, for example, on a left side of the folding area FDA. The touch sensing parts TSU according to an embodiment of the disclosure may be formed and disposed on the first non-folding area NFA1 and the second non-folding area NFA2.

A first folding line FOL1 and a second folding line FOL2 may extend in a second direction (Y-axis direction), and the display device 10 may be folded in the first direction (X-axis direction). Accordingly, a length of the display device 10 in the first direction (X-axis direction) may be reduced by about half, and a user may conveniently carry the display device 10.

An extension direction of the first folding line FOL1 and an extension direction of the second folding line FOL2 may be the second direction (Y-axis direction), but the disclosure is not limited thereof. For example, the first folding line FOL1 and the second folding line FOL2 may extend in the first direction (X-axis direction), and the display device 10 may be folded in the second direction (Y-axis direction). A length of the display device 10 in the second direction (Y-axis direction) may be reduced by about half. In another embodiment, the first folding line FOL1 and the second folding line FOL2 may extend in a diagonal direction of the display device 10 corresponding to a direction between the first direction (X-axis direction) and the second direction (Y-axis direction). The display device 10 may be folded in a triangular shape.

In case that the first folding line FOL1 and the second folding line FOL2 extend in the second direction (Y-axis direction), a length of the folding area FDA in the first direction (X-axis direction) may be less than a length of the folding area FDA in the second direction (Y-axis direction). A length of the first non-folding area NFA1 in the first direction (X-axis direction) may be greater than the length of the folding area FDA in the first direction (X-axis direction). A length of the second non-folding area NFA2 in the first direction (X-axis direction) may be greater than the length of the folding area FDA in the first direction (X-axis direction).

A first display area DA1 may be disposed on a front surface of the display device 10. The first display area DA1 may overlap the folding area FDA, the first non-folding area NFA1, and the second non-folding area NFA2 in the thickness direction of the display device 10. Therefore, in case that the display device 10 is unfolded, an image may be displayed in a front surface direction in the folding area FDA, the first non-folding area NFA1, and the second non-folding area NFA2 of the display device 10.

The first display area DA1 may be divided into an image display area IDA in which light sensing pixels are not disposed and only display pixels (see, e.g., SP of FIG. 5) are disposed and a light sensing area FSA in which both the display pixels and the light sensing pixels LSP are disposed. Since the light sensing area FSA operates as an illuminance sensor, the light sensing area FSA may be disposed together with the display pixels only in a preset outer area.

A second display area DA2 may be disposed on a rear surface of the display device 10. The second display area DA2 may overlap the second non-folding area NFA2 in the thickness direction of the display device 10. Therefore, in case that the display device 10 is folded, an image may be displayed in a front surface direction in the second non-folding area NFA2 of the display device 10.

The second display area DA2 may also be divided into an image display area IDA in which light sensing pixels are not disposed and only display pixels are disposed and a light sensing area FSA in which both the display pixels and the light sensing pixels LSP are disposed. Since the light sensing area FSA in the second display area DA2 is an illuminance sensor, the light sensing area FSA may be disposed together with the display pixels only in a preset outer area.

FIGS. 15 and 16 illustrate that a through hole TH in which a camera SDA or the like is formed is disposed in the first non-folding area NFA1, but the disclosure is not limited thereto. The through hole TH or the camera SDA may be disposed in the second non-folding area NFA2 or the folding area FDA.

Figure 17:
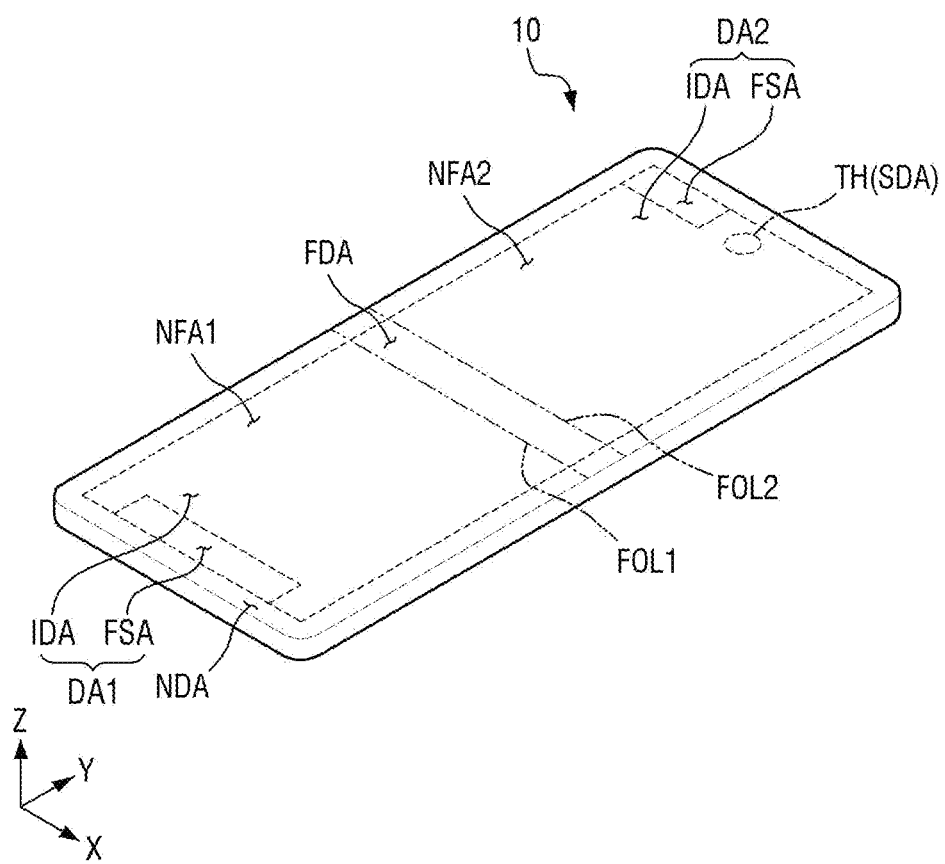
FIGS. 17 and 18 are schematic perspective views illustrating a display device according to another embodiment.
Figure 18:
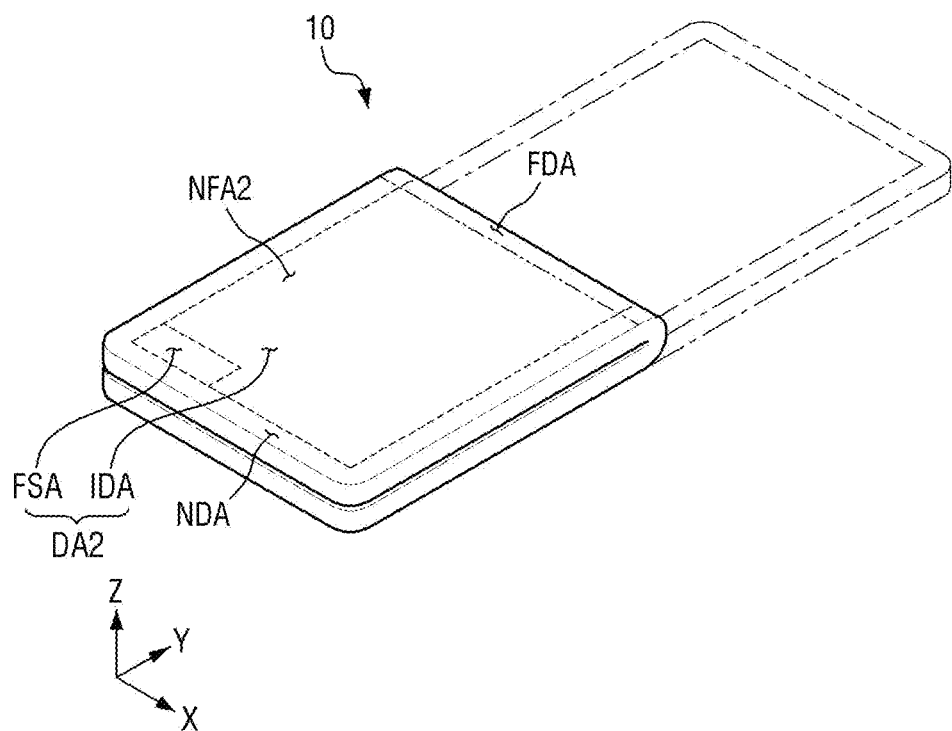

FIGS. 17 and 18 are schematic perspective views illustrating a display device 10 according to another embodiment.

FIGS. 17 and 18 illustrate that a display device 10 is a foldable display device that is bendable or foldable in the second direction (Y-axis direction). The display device 10 may be maintained in both a folded state and an unfolded state. The display device 10 may be folded in an in-folding manner in which a front surface of the display device 10 is disposed inside. In case that the display device 10 is bent or folded in the in-folding manner, front surfaces of the display device 10 may face each other. In another embodiment, the display device 10 may be folded in an out-folding manner in which a front surface of the display device 10 is disposed outside. In case that the display device 10 is bent or folded in the out-folding manner, rear surfaces of the display device 10 may face each other.

The display device 10 may include a folding area FDA, a first non-folding area NFA1, and a second non-folding area NFA2. The folding area FDA may be an area in which the display device 10 is folded, and the first non-folding area NFA1 and the second non-folding area NFA2 may be areas in which the display device 10 is not folded. The first non-folding area NFA1 may be disposed on a side, for example, a lower end of the folding area FDA. The second non-folding area NFA2 may be disposed on another side, for example, on an upper end of the folding area FDA.

The touch sensing parts TSU according to an embodiment of the disclosure may be formed and disposed on the first non-folding area NFA1 and the second non-folding area NFA2.

On the other hand, the folding area FDA may be an area bent with a curvature (e.g., a predetermined or selectable curvature) in a first folding line FOL1 and a second folding line FOL2. Therefore, the first folding line FOL1 may be a boundary between the folding area FDA and the first non-folding area NFA1, and the second folding line FOL2 may be a boundary between the folding area FDA and the second non-folding area NFA2.

Referring to FIGS. 17 and 18, first folding line FOL1 and the second folding line FOL2 may extend in the first direction (X-axis direction), and the display device 10 may be folded in the second direction (Y-axis direction). Accordingly, a length of the display device 10 in the second direction (Y-axis direction) may be reduced by about half, and a user may conveniently carry the display device 10.

An extension direction of the first folding line FOL1 and an extension direction of the second folding line FOL2 may be the first direction (X-axis direction), but the disclosure is not limited thereto. For example, the first folding line FOL1 and the second folding line FOL2 may extend in the second direction (Y-axis direction), and the display device 10 may be folded in the first direction (X-axis direction). A length of the display device 10 in the first direction (X-axis direction) may be reduced by about half. In another embodiment, the first folding line FOL1 and the second folding line FOL2 may extend in a diagonal direction of the display device 10 corresponding to a direction between the first direction (X-axis direction) and the second direction (Y-axis direction). The display device 10 may be folded in a triangular shape.

In case that the first folding line FOL1 and the second folding line FOL2 extend in the first direction (X-axis direction) as illustrated in FIGS. 17 and 18, a length of the folding area FDA in the second direction (Y-axis direction) may be less than a length of the folding area FDA in the first direction (X-axis direction). A length of the first non-folding area NFA1 in the second direction (Y-axis direction) may be greater than the length of the folding area FDA in the second direction (Y-axis direction). A length of the second non-folding area NFA2 in the second direction (Y-axis direction) may be greater than the length of the folding area FDA in the second direction (Y-axis direction).

A first display area DA1 may be disposed on a front surface of the display device 10. The first display area DA1 may overlap the folding area FDA, the first non-folding area NFA1, and the second non-folding area NFA2 in the thickness direction of the display device 10. Therefore, in case that the display device 10 is unfolded, an image may be displayed in a front surface direction in the folding area FDA, the first non-folding area NFA1, and the second non-folding area NFA2 of the display device 10.

The first display area DA1 may be divided into an image display area IDA in which light sensing pixels are not disposed and only display pixels are disposed and a light sensing area FSA in which both the display pixels and the light sensing pixels LSP are disposed. Since the light sensing area FSA operates as an illuminance sensor, the light sensing area FSA may be disposed together with the display pixels only in a preset outer area.

A second display area DA2 may be disposed on a rear surface of the display device 10. The second display area DA2 may overlap the second non-folding area NFA2 in the thickness direction of the display device 10. Therefore, when the display device 10 is folded, an image may be displayed in a front surface direction in the second non-folding area NFA2 of the display device 10.

The second display area DA2 may also be divided into an image display area IDA in which light sensing pixels are not disposed and only display pixels are disposed and a light sensing area FSA in which both the display pixels and the light sensing pixels LSP are disposed. Since the light sensing area FSA in the second display area DA2 is an illuminance sensor, the light sensing area FSA may be disposed together with the display pixels only in a preset outer area.

FIGS. 17 and 18 illustrate that a through hole TH in which a camera SDA or the like is disposed is disposed in the second non-folding area NFA2, but the disclosure is not limited thereto. The through hole TH may be disposed in the first non-folding area NFA1 or the folding area FDA.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
  a display part including a plurality of unit pixels, each of the plurality of unit pixels including a plurality of display pixels and a light sensing pixel;
  a plurality of touch electrodes disposed between the plurality of display pixels and the light sensing pixel, surrounding circumferences of the plurality of display pixels and the light sensing pixel, and sensing a touch; and
  a main driving circuit sensing a fingerprint by the light sensing pixel, wherein
  the light sensing pixel in one of the plurality of unit pixels and the light sensing pixel in another one of the plurality of unit pixels have different light transmissivities for external light, and
  the main driving circuit analyzes light sensing signals of the light sensing pixels having the different light transmissivities to detect a luminance value or an illuminance value of the external light.

2. The display device of claim 1, wherein
  each of the plurality of unit pixels include at least three display pixels displaying red, green, and blue colors, and one of first to fourth light sensing pixels having different light transmissivities,
  the first light sensing pixel has a first transmissivity of a first range and detects light of a low luminance range,
  the second light sensing pixel has a second transmissivity of a second range and detects light of a middle luminance range,
  the third light sensing pixel has a third transmissivity of a third range and detects light of a high luminance range, and the fourth light sensing pixel has a fourth transmissivity of a fourth range and detects light of an ultra-high luminance range.

3. The display device of claim 2, wherein
the first light sensing pixel includes a first light sensing part and a first sensing driving part,
neither color filter layer nor black matrix layer is formed on a front surface of the first light sensing part and the first light sensing part has a first light transmissivity of about 100%,
the second light sensing pixel includes a second light sensing part and a second sensing driving part,
a color filter layer of one of red, green, and blue colors is formed on a front surface of the second light sensing part and the second light sensing part has a second light transmissivity in a range of about 24% to about 33%,
the third light sensing pixel includes a third light sensing part and a third sensing driving part,
two color filter layers of two of red, green, and blue colors are formed on a front surface of the third light sensing part and the third light sensing part has a third light transmissivity in a range of about 1.1% to about 5.8%,
the fourth light sensing pixel includes a fourth light sensing part and a fourth sensing driving part, and
a black matrix layer is formed on a front surface of the fourth light sensing part and the fourth light sensing part has a fourth light transmissivity in a range of about 0.3% to about 1%.

4. The display device of claim 1, wherein
the plurality of unit pixels comprise:
a plurality of first unit pixels including first to third display pixels displaying red, green, and blue colors, respectively, and a first light sensing pixel;
a plurality of second unit pixels including the first to third display pixels, and a second light sensing pixel;
a plurality of third unit pixels including the first to third display pixels, and a third light sensing pixel; and
a plurality of fourth unit pixels including the first to third display pixels, and a fourth light sensing pixel,
the first light sensing pixel has a first transmissivity of a first range and detects light of a low luminance range,
the second light sensing pixel has a second transmissivity of a second range and detects light of a middle luminance range,
the third light sensing pixel has a third transmissivity of a third range and detects light of a high luminance range, and
the fourth light sensing pixel has a fourth transmissivity of a fourth range and detects light of an ultra-high luminance range.

5. The display device of claim 1, wherein
the plurality of unit pixels comprise:
a plurality of first unit pixels including first to fourth display pixels displaying red, green, blue, and green colors, respectively, and a first light sensing pixel;
a plurality of second unit pixels including the first to fourth display pixels, and a second light sensing pixel;
a plurality of third unit pixels including the first to fourth display pixels, and a third light sensing pixel; and
a plurality of fourth unit pixels including the first to fourth display pixels, and a fourth light sensing pixel,
the first light sensing pixel has a first transmissivity of a first range and detects light of a low luminance range,
the second light sensing pixel has a second transmissivity of a second range and detects light of a middle luminance range,
the third light sensing pixel has a third transmissivity of a third range and detects light of a high luminance range, and
the fourth light sensing pixel has a fourth transmissivity of a fourth range and detects light of an ultra-high luminance range.

6. The display device of claim 5, wherein
the number of the plurality of first to fourth unit pixels disposed in a unit area is in a ratio of about 1:3:3:1,
the plurality of first to third unit pixels are arranged in a zigzag pattern in a first direction, and
one of the plurality of first unit pixels, one of the plurality of second unit pixels, one of the plurality of third unit pixels, and another one of the plurality of third unit pixels are repeatedly arranged in the first direction.

7. The display device of claim 6, wherein
a first light sensing part of the first light sensing pixel, a second light sensing part of the second light sensing pixel, a third light sensing part of the third light sensing pixel, and the third light sensing part of the third light sensing pixel are repeatedly arranged in odd-numbered unit pixel rows in a zigzag pattern in the first direction,
neither color filter layer nor black matrix layer is formed on a front surface of the first light sensing part and the first light sensing part has a first light transmissivity of about 100%,
a color filter layer of one of red, green, and blue colors is formed on a front surface of the second light sensing part and the second light sensing part has a second light transmissivity in a range of about 24% to about 33%, and
two color filter layers of two of red, green, and blue colors are formed on a front surface of the third light sensing part and the third light sensing part has a third light transmissivity in a range of about 1.1% to about 5.8%.

8. The display device of claim 6, wherein one of the plurality of second unit pixels, another one of the plurality of second unit pixels, one of the plurality of third unit pixels, and one of the plurality of fourth unit pixels are arranged repeatedly in a zigzag pattern in the first direction.

9. The display device of claim 8, wherein
a second light sensing part of the second light sensing pixel, the second light sensing part of the second light sensing pixel, a third light sensing part of the third light sensing pixel, and a fourth light sensing part of the fourth light sensing pixel are repeatedly arranged in even-numbered unit pixel rows in a zigzag pattern in the first direction,
a color filter layer of one of red, green, and blue colors is formed on a front surface of the second light sensing part and the second light sensing part has a second light transmissivity in a range of about 24% to about 33%,
two color filter layers of two of red, green, and blue colors are formed on a front surface of the third light sensing part and the third light sensing part has a third light transmissivity in a range of about 1.1% to about 5.8%, and
a black matrix layer is formed on a front surface of the fourth light sensing part and the fourth light sensing part has a fourth light transmissivity in a range of about 0.3% to about 1%.

10. The display device of claim 5, wherein the main driving circuit:

converts the light sensing signals generated from the first light sensing pixel into digital light sensing signals, compares and analyzes the digital light sensing signals of the first light sensing pixel with low luminance and low illuminance reference data, and detects a luminance value and an illuminance value for external light of low luminance and low illuminance ranges, converts the light sensing signals generated from the second light sensing pixel into digital light sensing signals, compares and analyzes the digital light sensing signals of the second light sensing pixel with middle luminance and middle illuminance reference data, and detects a luminance value and an illuminance value for external light of middle luminance and middle illuminance ranges, converts the light sensing signals generated from the third light sensing pixel into digital light sensing signals, compares and analyzes the digital light sensing signals of the third light sensing pixel with high luminance and high illuminance reference data, and detects a luminance value and an illuminance value for external light of high luminance and high illuminance ranges, and converts the light sensing signals generated from the fourth light sensing pixel into digital light sensing signals, compares and analyzes the digital light sensing signals of the fourth light sensing pixel with ultra-high luminance and ultra-high illuminance reference data, and detects a luminance value and an illuminance value for external light of ultra-high luminance and ultra-high illuminance ranges.

11. A display device comprising:
a display part including a plurality of unit pixels; and
a main driving circuit sensing a fingerprint by light sensing pixels each included in the plurality of unit pixels, wherein
the plurality of unit pixels include at least three display pixels displaying red, green, and blue colors, and one of first to fourth light sensing pixels having different light transmissivities, and
the main driving circuit analyzes light sensing signals of the first to fourth light sensing pixels to detect a luminance value or an illuminance value of external light.

12. The display device of claim 11, wherein
the first light sensing pixel has a first transmissivity of a first range and detects light of a low luminance range,
the second light sensing pixel has a second transmissivity of a second range and detects light of a middle luminance range,
the third light sensing pixel has a third transmissivity of a third range and detects light of a high luminance range, and
the fourth light sensing pixel has a fourth transmissivity of a fourth range and detects light of an ultra-high luminance range.

13. A display device comprising:
a light emitting part including a display part in which a plurality of unit pixels each including a plurality of display pixels and a light sensing pixel are alternately and sequentially arranged, the plurality of display pixels emitting one of red, green, and blue colors;
a main driving circuit analyzing light sensing signals of the light sensing pixels having different light transmissivities to detect a luminance value or an illuminance value of external light;
a pixel driving part controlling a driving of the light emitting part; and
at least one color filter layer covering the light emitting part and transmitting light of one of red, green, and blue colors, wherein
the light sensing pixel includes:
a light sensing part including a light sensing element; and
a sensing driving part controlling a driving of the light sensing part, and
a front surface of the light sensing part is opened or the at least one color filter layer or a black matrix layer is disposed on the front surface of the light sensing part.

14. The display device of claim 13, wherein each of the plurality of unit pixels include at least three display pixels displaying red, green, and blue colors, and one of first to fourth light sensing pixels having different light transmissivities.

15. An electronic device including a display device, the display device comprising:
a display part including a plurality of unit pixels, each of the plurality of unit pixels including a plurality of display pixels and a light sensing pixel;
a plurality of touch electrodes disposed between the plurality of display pixels and the light sensing pixel, surrounding circumferences of the plurality of display pixels and the light sensing pixel, and sensing a touch; and
a main driving circuit sensing a fingerprint by the light sensing pixel, wherein the light sensing pixel in one of the plurality of unit pixels and the light sensing pixel in another one of the plurality of unit pixels have different light transmissivities for external light, and the main driving circuit analyzes light sensing signals of the light sensing pixels having the different light transmissivities to detect a luminance value or an illuminance value of the external light.

* * * * *